United States Patent
Hondo et al.

(10) Patent No.: US 9,293,599 B2
(45) Date of Patent: Mar. 22, 2016

(54) SEMICONDUCTOR DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventors: Suguru Hondo, Kanagawa (JP); Daigo Ito, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/278,705

(22) Filed: May 15, 2014

(65) Prior Publication Data

US 2014/0339547 A1  Nov. 20, 2014

(30) Foreign Application Priority Data

May 20, 2013  (JP) ................................. 2013-106165

(51) Int. Cl.
*H01L 21/00*  (2006.01)
*H01L 29/786*  (2006.01)
(Continued)

(52) U.S. Cl.
CPC ........ *H01L 29/7869* (2013.01); *H01L 23/3192* (2013.01); *H01L 29/42384* (2013.01);
(Continued)

(58) Field of Classification Search
CPC ..................... H01L 29/7869; H01L 29/78648; H01L 29/78603; H01L 29/78609; H01L 29/78606; H01L 29/42384; H01L 29/66969; H01L 23/3192; H01L 2924/0002
See application file for complete search history.

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

EP  1737044 A  12/2006
EP  2226847 A  9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Su C Kim
(74) *Attorney, Agent, or Firm* — Nixon Peabody LLP; Jeffrey L. Costellia

(57) ABSTRACT

A transistor with stable electric characteristics is provided. A transistor with small variation in electrical characteristics is provided. A miniaturized transistor is provided. A transistor having low off-state current is provided. A transistor having high on-state current is provided. A semiconductor device including the transistor is provided. One embodiment of the present invention is a semiconductor device including an island-shaped stack including a base insulating film and an oxide semiconductor film over the base insulating film; a protective insulating film facing a side surface of the stack and not facing a top surface of the stack; a first conductive film and a second conductive film which are provided over and in contact with the stack to be apart from each other; an insulating film over the stack, the first conductive film, and the second conductive film; and a third conductive film over the insulating film.

20 Claims, 18 Drawing Sheets

(51) Int. Cl.
*H01L 29/66* (2006.01)
*H01L 23/31* (2006.01)
*H01L 29/423* (2006.01)

(52) U.S. Cl.
CPC .... *H01L29/66969* (2013.01); *H01L 29/78603* (2013.01); *H01L 29/78606* (2013.01); *H01L 29/78609* (2013.01); *H01L 29/78648* (2013.01); *H01L 2924/0002* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,869,833 B1 * | 3/2005 | Chen .................... 438/158 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0240990 A1 * | 10/2011 | Yamazaki ..................... 257/43 |
| 2011/0284844 A1 | 11/2011 | Endo et al. |
| 2013/0009148 A1 | 1/2013 | Yamazaki |
| 2013/0193493 A1 | 8/2013 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-009836 A | 1/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H at al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H , "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys, Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFe2O4, and YB2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, Vol, 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner 116a 106 104 116b 108

118 112 102 101
104 106 108 100

FIG. 3A1
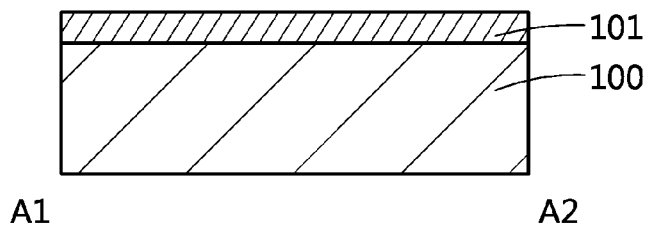
FIG. 3A2
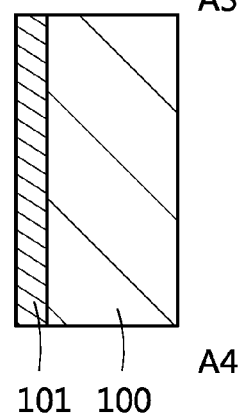
FIG. 3B1
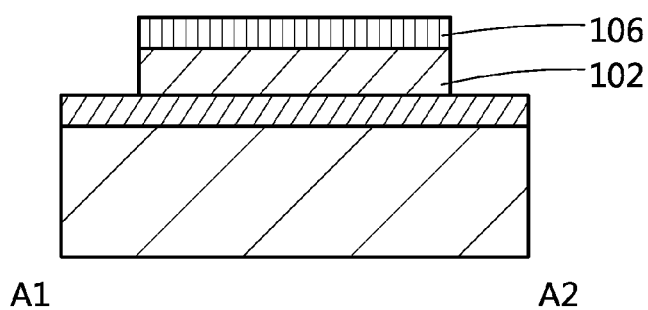
FIG. 3B2
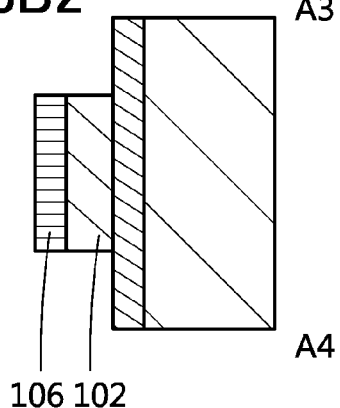
FIG. 3C1
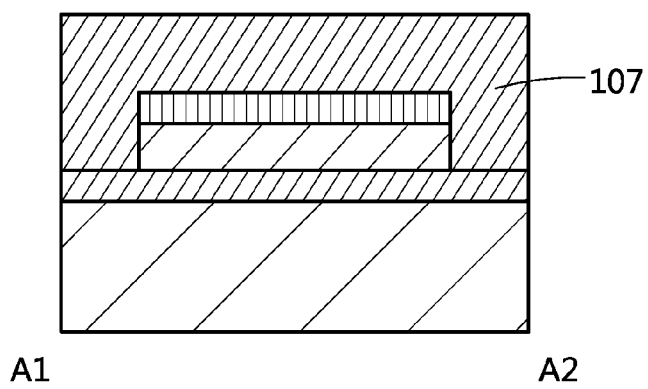
FIG. 3C2
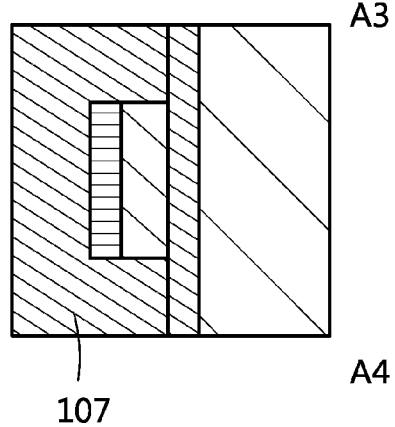

FIG. 4A1
FIG. 4A2
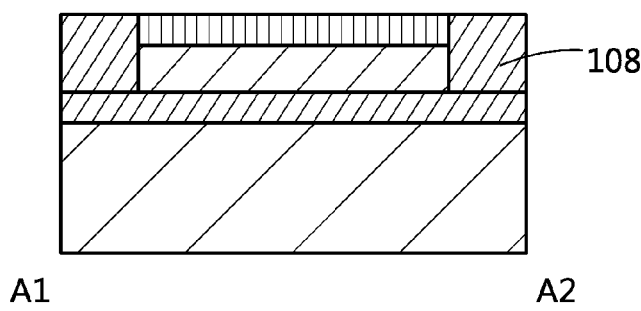
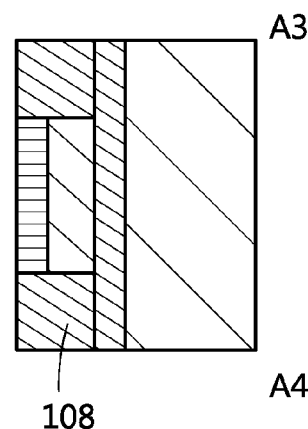
FIG. 4B1
FIG. 4B2
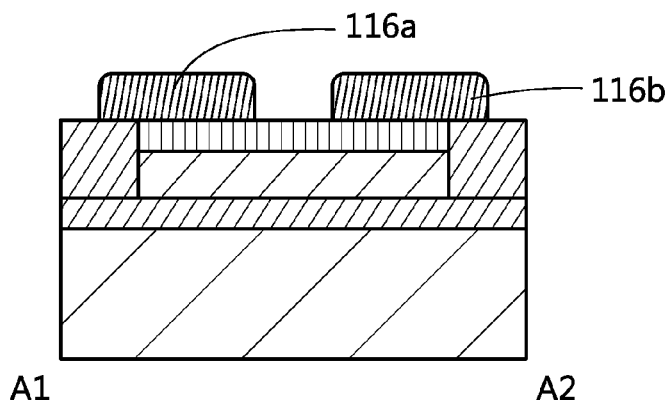
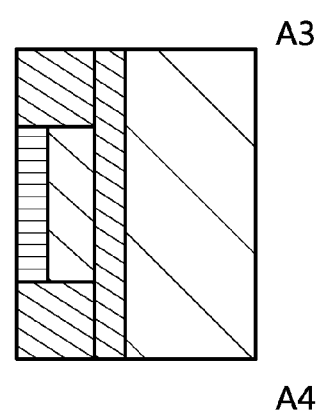
FIG. 4C1
FIG. 4C2
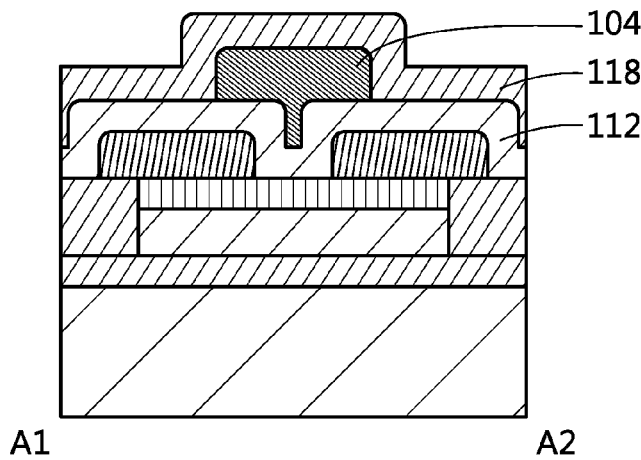
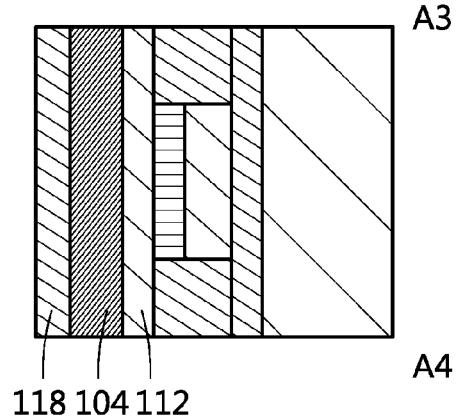

FIG. 6A1
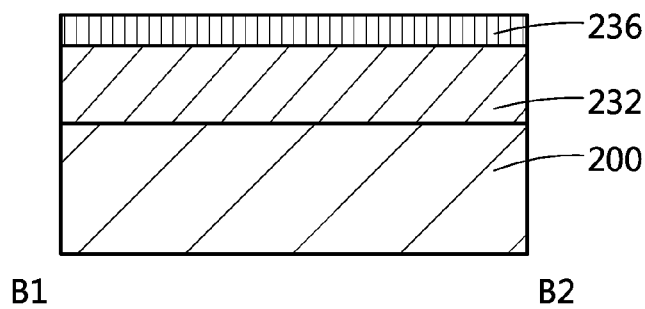
FIG. 6A2
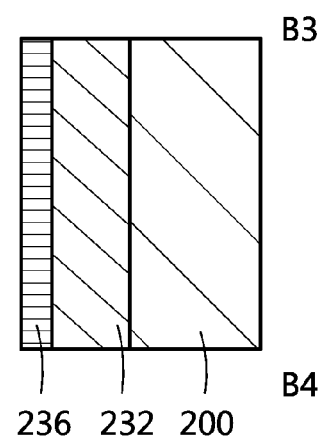
FIG. 6B1
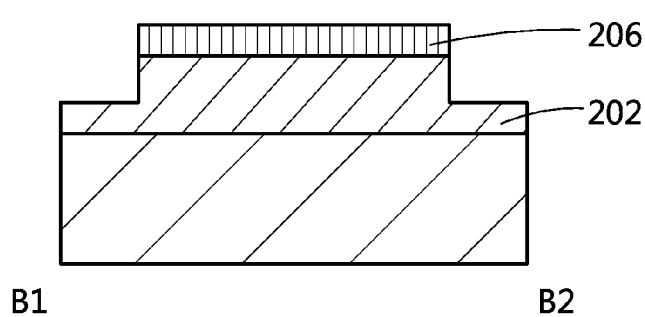
FIG. 6B2
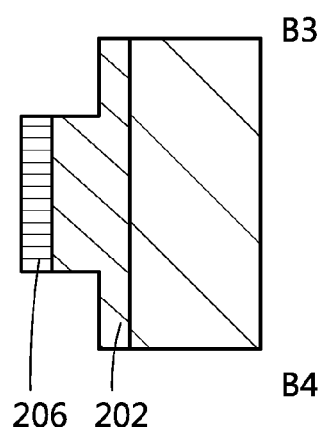
FIG. 6C1
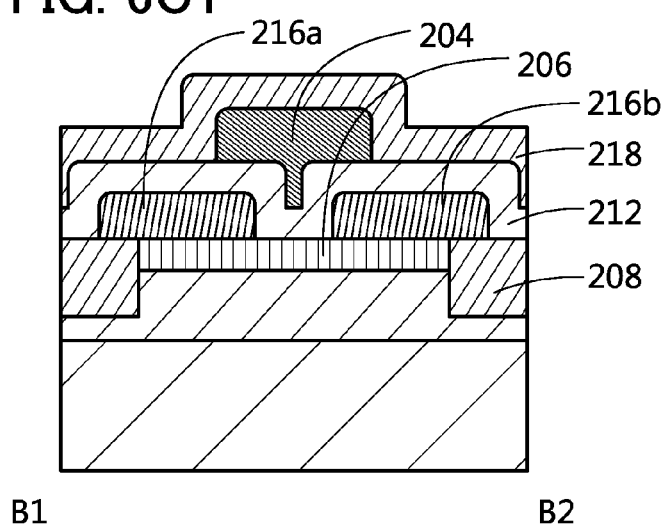
FIG. 6C2
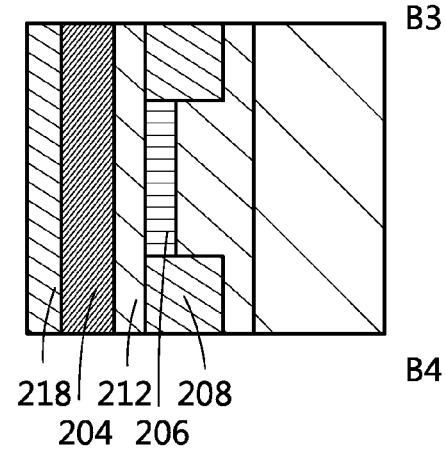

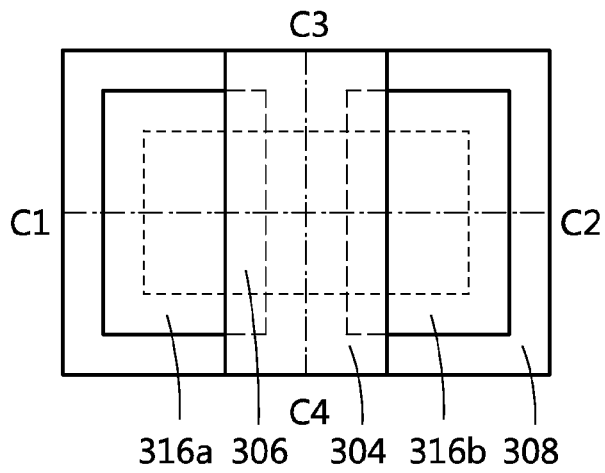
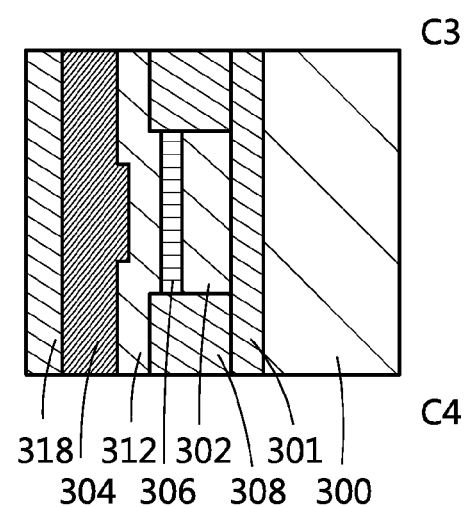
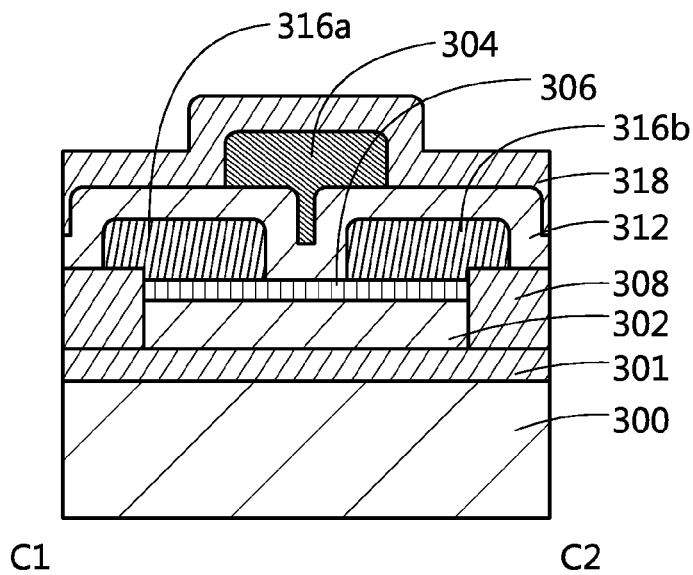

FIG. 8A1
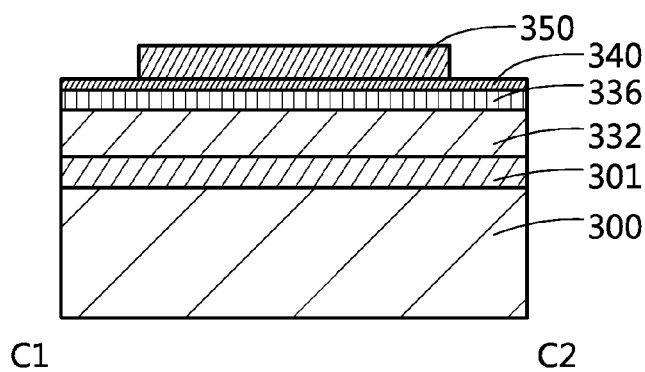
FIG. 8A2
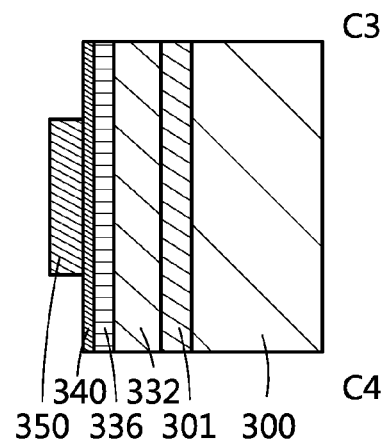
FIG. 8B1
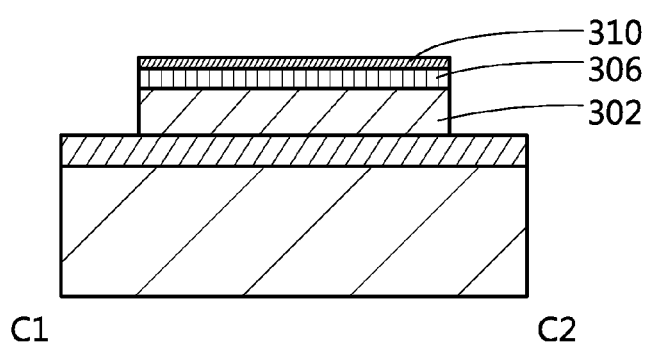
FIG. 8B2
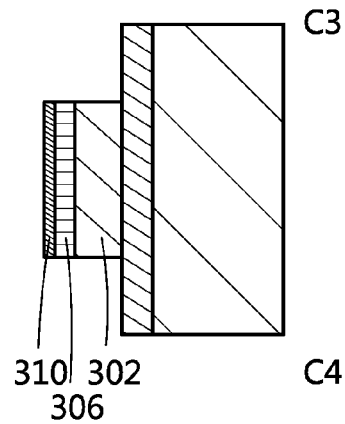
FIG. 8C1
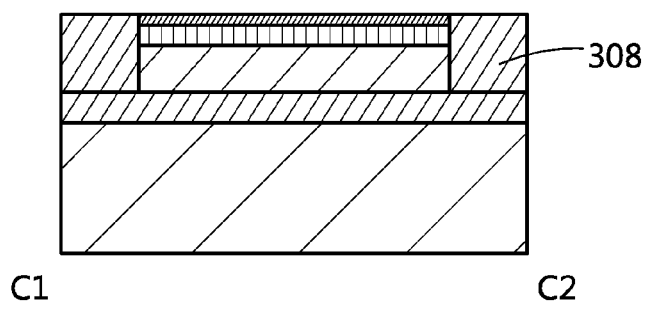
FIG. 8C2
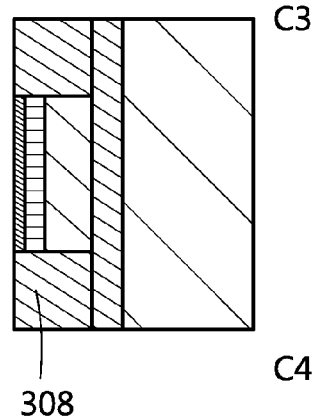

FIG. 9A1
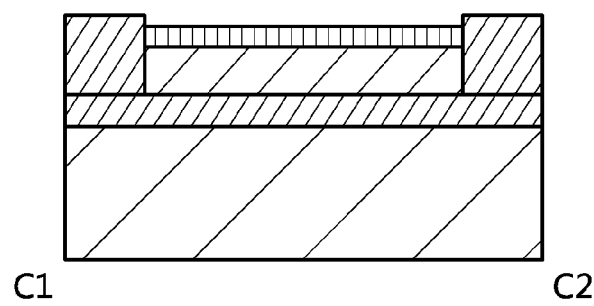
FIG. 9A2
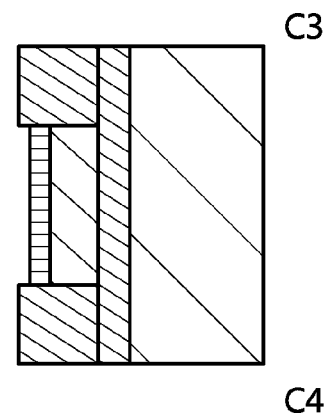
FIG. 9B1
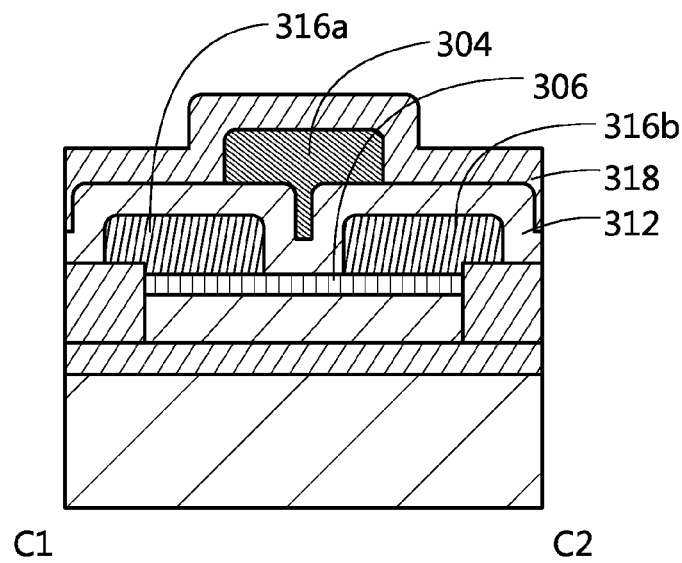
FIG. 9B2
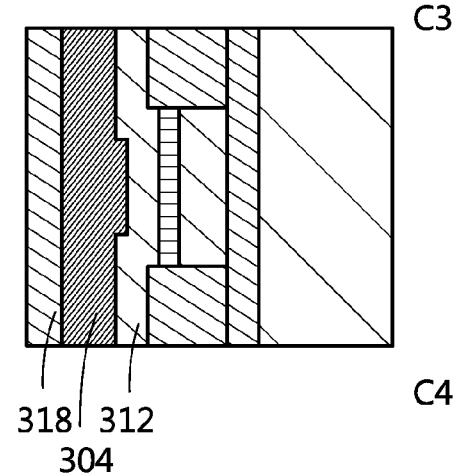

416a 406 404 416b 408

418 412 402 401
404 406 408 400

423a | 411 | 405 | 423b 409
417a 407 417b

419 | 413 | 403 | 401
405 407 409 400

FIG. 12A1
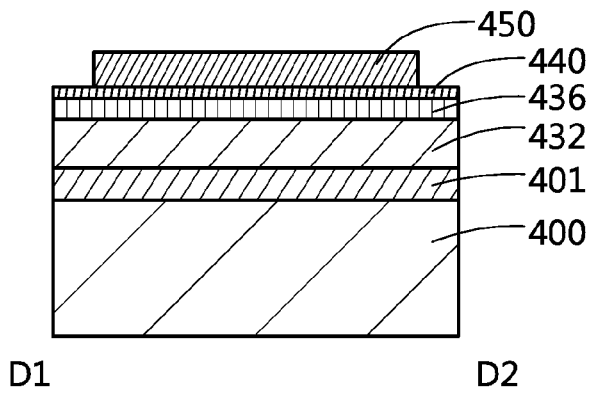
FIG. 12A2
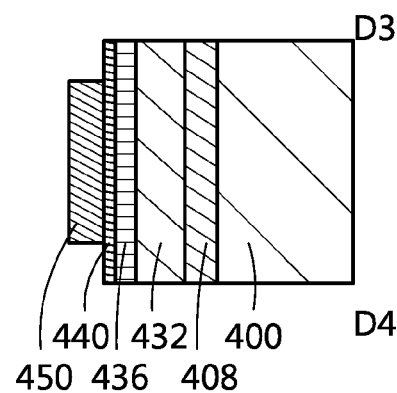
FIG. 12B1
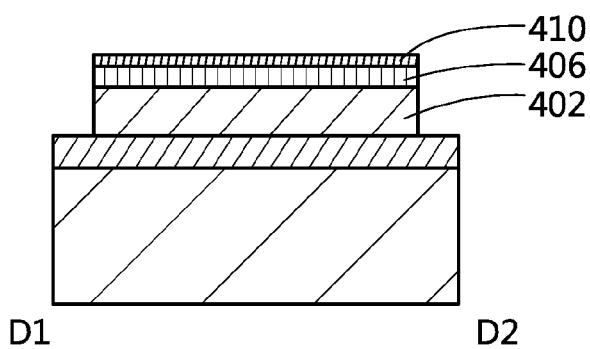
FIG. 12B2
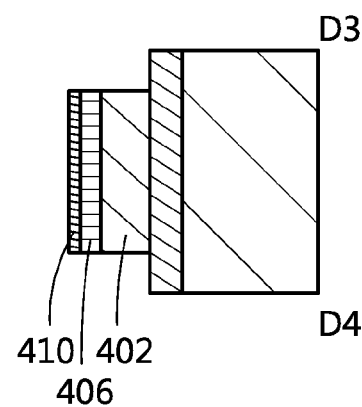
FIG. 12C1
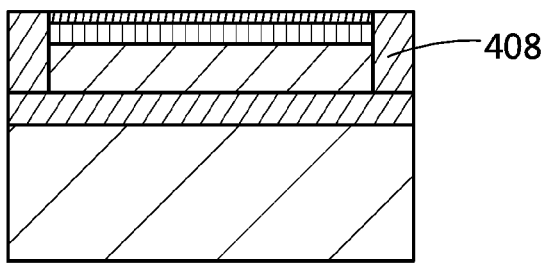
FIG. 12C2
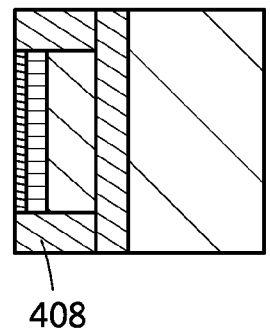

FIG. 13A1
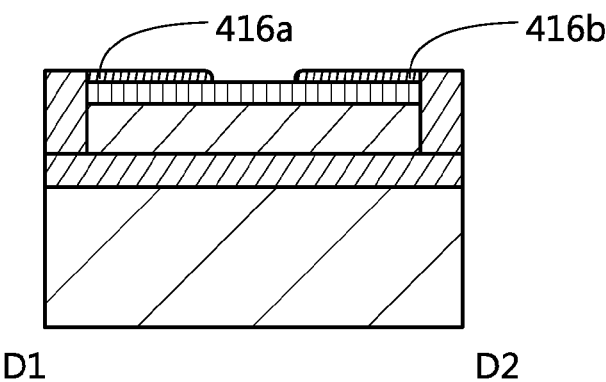
FIG. 13A2
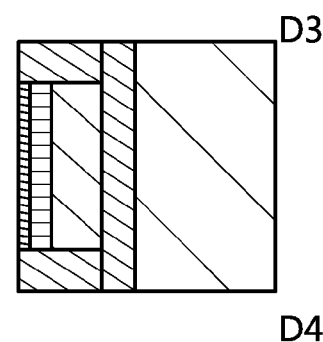
FIG. 13B1
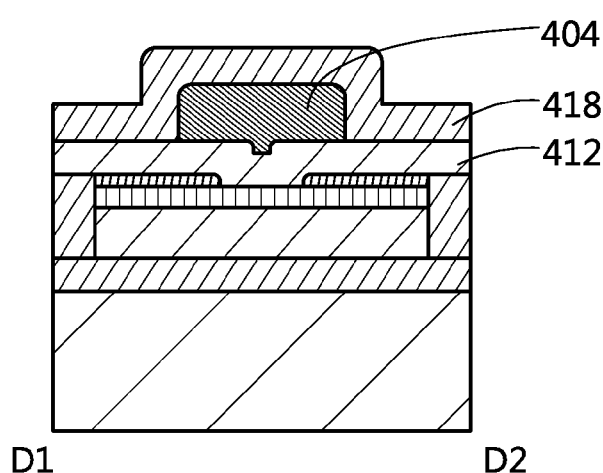
FIG. 13B2
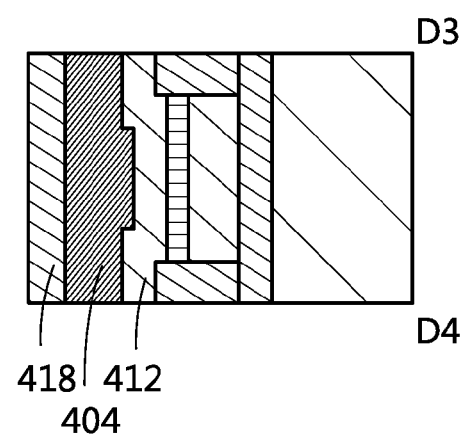

FIG. 16A1
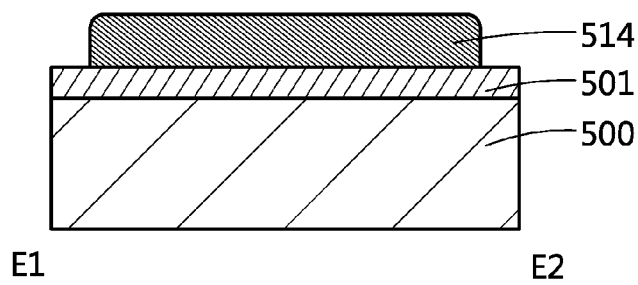
FIG. 16A2
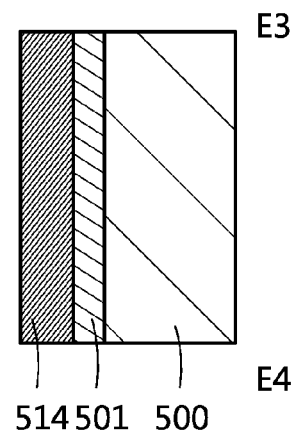
FIG. 16B1
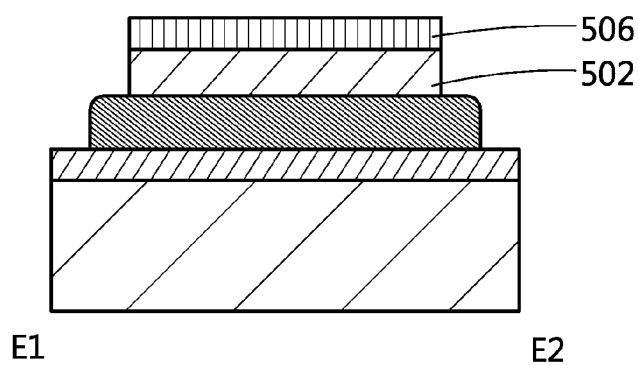
FIG. 16B2
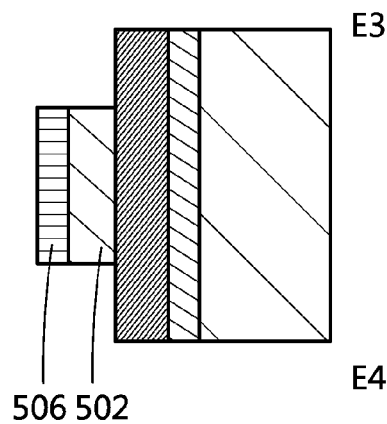
FIG. 16C1
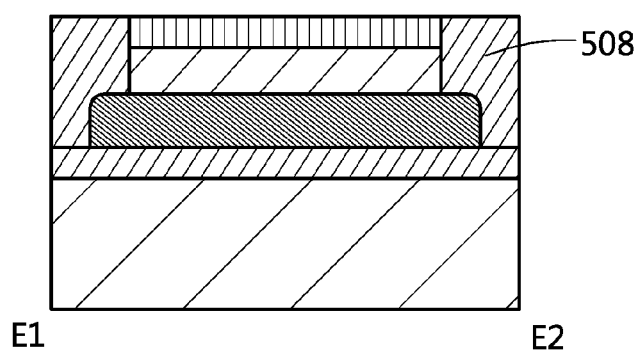
FIG. 16C2
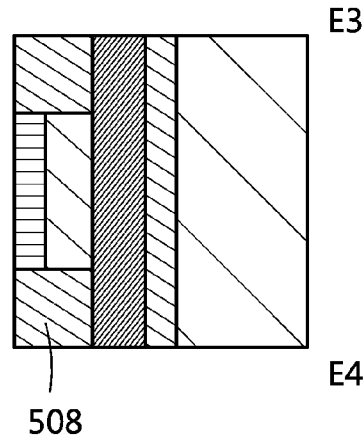

FIG. 17A1
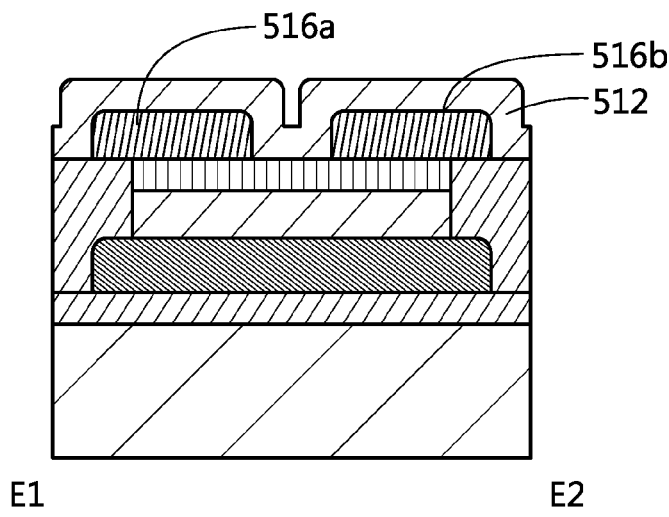
FIG. 17A2
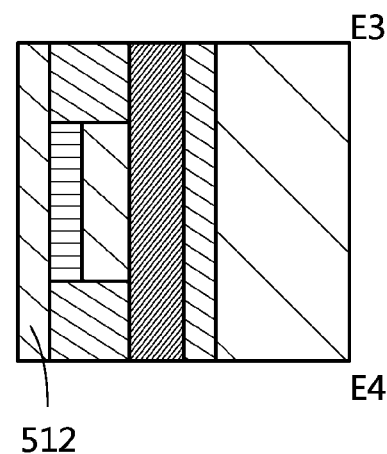
FIG. 17B1
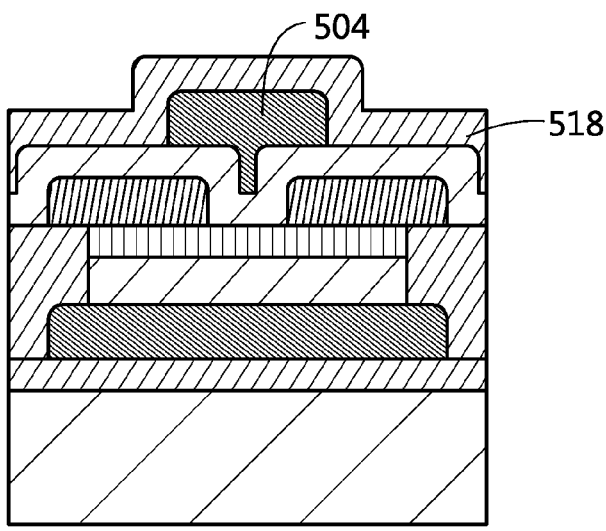
FIG. 17B2
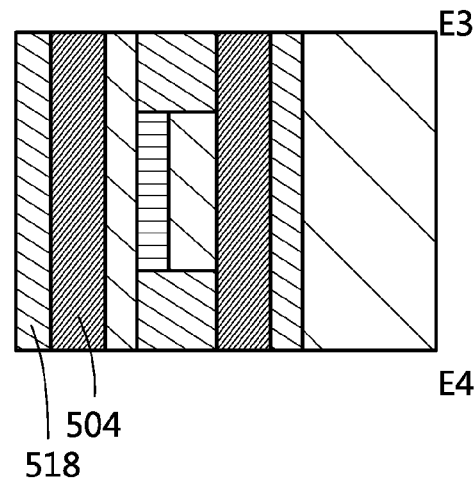

SEMICONDUCTOR DEVICE AND METHOD FOR MANUFACTURING THE SAME

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to a semiconductor device, a display device, a liquid crystal display device, a light-emitting device, a driving method thereof, or a manufacturing method thereof, for example. Furthermore, the present invention relates to a semiconductor device, a display device, or a light-emitting device each including a transistor, or a driving method thereof, for example. The present invention relates to an electronic appliance or the like including the semiconductor device, the display device, or the light-emitting device.

Note that in this specification, a semiconductor device refers to any device that can function by utilizing semiconductor characteristics, and an electro-optical device, a semiconductor circuit, an electronic appliance, and the like are all included in the category of the semiconductor device.

2. Description of the Related Art

Attention has been focused on a technique for forming a transistor using a semiconductor film which is formed on a substrate having an insulating surface. The transistor is applied to a wide range of semiconductor devices such as an integrated circuit and a display device. A silicon film is known as a semiconductor film applicable to a transistor.

As the silicon film used as a semiconductor film of a transistor, either an amorphous silicon film or a polycrystalline silicon film is used depending on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits are formed over the same substrate, it is preferred to use a polycrystalline silicon film, which can form a transistor having a high field-effect mobility.

In recent years, a transistor that includes an oxide semiconductor film containing indium, gallium, and zinc has attracted attention.

An oxide semiconductor film can be formed by a sputtering method or the like, and thus can be used for a transistor included in a large display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

As a method for providing a transistor including an oxide semiconductor film with stable electrical characteristics, a technique where an insulating film containing excess oxygen is used as an insulating film in contact with an oxide semiconductor film is disclosed (see Patent Document 1). The technique disclosed in Patent Document 1 enables oxygen vacancy in an oxide semiconductor film to be reduced. As a result, variation in electric characteristics of the transistor including the oxide semiconductor film can be reduced and reliability can be improved.

REFERENCE

Patent Document

[Patent Document 1] Japanese Published Patent Application No. 2012-9836

SUMMARY OF THE INVENTION

One object is to provide a transistor with stable electric characteristics. Another object is to provide a transistor with small variation in electrical characteristics. Another object is to provide a miniaturized transistor. Another object is to provide a transistor having low off-state current. Another object is to provide a transistor having high on-state current.

Another object is to provide a semiconductor device including the transistor. Another object is to provide a highly integrated semiconductor device. Another object is to provide a semiconductor device with high productivity. Another object is to provide a semiconductor device with high yield.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is, for example, a semiconductor device including an island-shaped stack which is provided over a substrate and includes a base insulating film and an oxide semiconductor film over the base insulating film; a protective insulating film facing a side surface of the stack and not facing a top surface of the stack; a first conductive film and a second conductive film which are provided over and in contact with the stack to be apart from each other; an insulating film over the stack, the first conductive film, and the second conductive film; and a third conductive film over the insulating film.

Another embodiment of the present invention is, for example, a semiconductor device including a first conductive film over a substrate; an island-shaped stack which is provided over the first conductive film and includes a base insulating film and an oxide semiconductor film over the base insulating film; a protective insulating film which faces a side surface of the first conductive film and a side surface of the stack and does not face a top surface of the stack; and a second conductive film and a third conductive film which are provided over and in contact with the stack to be apart from each other.

Another embodiment of the present invention is, for example, a semiconductor device including a first conductive film over a substrate; an island-shaped stack including a base insulating film over the first conductive film and an oxide semiconductor film over the base insulating film; a protective insulating film which faces a side surface of the first conductive film and a side surface of the stack and does not face a top surface of the stack; a second conductive film and a third conductive film which are provided over and in contact with the stack to be apart from each other; an insulating film over the stack, the second conductive film, and the third conductive film; and a fourth conductive film over the insulating film.

In the semiconductor device of one embodiment of the present invention, the protective insulating film is an aluminum oxide film, for example.

In the semiconductor device of one embodiment of the present invention, a silicon oxide film including an oxygen-excess region is provided between the stack and the protective insulating film, for example.

In the semiconductor device of one embodiment of the present invention, the base insulating film is a silicon oxide film including an oxygen-excess region, for example.

In the semiconductor device of one embodiment of the present invention, the oxide semiconductor film contains indium, gallium, and zinc, for example.

In the semiconductor device of one embodiment of the present invention, the stack includes a base oxide semiconductor film between the base insulating film and the oxide semiconductor film, for example. Note that the base oxide semiconductor film preferably contains indium, gallium, and zinc.

In the semiconductor device of one embodiment of the present invention, the stack includes a protective oxide semiconductor film over and in contact with the oxide semiconductor film, for example. Note that the base oxide semiconductor film preferably contains indium, gallium, and zinc.

Another embodiment of the present invention is, for example, a method for manufacturing a semiconductor device, including the steps of forming a base insulating film over a substrate; forming an oxide semiconductor film over the base insulating film; forming an island-shaped mask over the oxide semiconductor film; etching a region over which the mask is not provided in each of the base insulating film and the oxide semiconductor film to form an island-shaped stack and a grid-like groove; removing the mask; forming a protective insulating film over the island-shaped stack and in the grid-like groove; etching and planarizing the protective insulating film until the island-shaped stack is exposed to form a grid-like protective insulating film in the grid-like groove; forming a first conductive film and a second conductive film over the island-shaped stack to be apart from each other; forming an insulating film over the island-shaped stack, the first conductive film, and the second conductive film; and forming a third conductive film over the insulating film.

Another embodiment of the present invention is, for example, a method for manufacturing a semiconductor device, including the steps of forming a base insulating film over a substrate; forming an oxide semiconductor film over the base insulating film; forming an island-shaped mask over the oxide semiconductor film; etching a region over which the mask is not provided in each of the base insulating film and the oxide semiconductor film to form an island-shaped stack and a grid-like groove; forming a protective insulating film over the mask and in the grid-like groove; etching and planarizing the protective insulating film until the mask is exposed to form a grid-like protective insulating film in the grid-like groove; removing the mask; forming a first conductive film and a second conductive film over the island-shaped stack to be apart from each other; forming an insulating film over the island-shaped stack, the first conductive film, and the second conductive film; and forming a third conductive film over the insulating film.

Another embodiment of the present invention is, for example, a method for manufacturing a semiconductor device, including the steps of forming a base insulating film over a substrate; forming an oxide semiconductor film over the base insulating film; forming an island-shaped mask over the oxide semiconductor film; etching a region over which the mask is not provided in each of the base insulating film and the oxide semiconductor film to form an island-shaped stack and a grid-like groove; forming a protective insulating film over the mask and in the grid-like groove; etching and planarizing the protective insulating film until the mask is exposed to form a grid-like protective insulating film in the grid-like groove; forming a resist mask over the mask; etching a region over which the resist mask is not provided in the mask to form a first conductive film and a second conductive film being apart from each other; forming an insulating film over the island-shaped stack, the first conductive film, and the second conductive film; and forming a third conductive film over the insulating film.

Another embodiment of the present invention is, for example, a method for manufacturing a semiconductor device, including the steps of forming a first conductive film over a substrate; forming a base insulating film over the first conductive film; forming an oxide semiconductor film over the base insulating film; forming an island-shaped mask over the oxide semiconductor film; etching a region over which the mask is not provided in each of the base insulating film and the oxide semiconductor film to form an island-shaped stack and a grid-like groove; removing the mask; forming a protective insulating film over the island-shaped stack and in the grid-like groove; etching and planarizing the protective insulating film until the island-shaped stack is exposed to form a grid-like protective insulating film in the grid-like groove; and forming a second conductive film and a third conductive film over the island-shaped stack to be apart from each other.

Another embodiment of the present invention is, for example, a method for manufacturing a semiconductor device, including the steps of forming a first conductive film over a substrate; forming a base insulating film over the first conductive film; forming an oxide semiconductor film over the base insulating film; forming an island-shaped mask over the oxide semiconductor film; etching a region over which the mask is not provided in each of the base insulating film and the oxide semiconductor film to form an island-shaped stack and a grid-like groove; forming a protective insulating film over the mask and in the grid-like groove; etching and planarizing the protective insulating film until the mask is exposed to form a grid-like protective insulating film in the grid-like groove; removing the mask; and forming a second conductive film and a third conductive film over the island-shaped stack to be apart from each other.

Another embodiment of the present invention is, for example, a method for manufacturing a semiconductor device, including the steps of forming a first conductive film over a substrate; forming a base insulating film over the first conductive film; forming an oxide semiconductor film over the base insulating film; forming an island-shaped mask over the oxide semiconductor film; etching a region over which the mask is not provided in each of the base insulating film and the oxide semiconductor film to form an island-shaped stack and a grid-like groove; forming a protective insulating film over the mask and in the grid-like groove; etching and planarizing the protective insulating film until the mask is exposed to form a grid-like protective insulating film in the grid-like groove; forming a resist mask over the mask; and etching a region over which the resist mask is not provided in the mask to form a second conductive film and a third conductive film being apart from each other.

In the method for manufacturing a semiconductor device of one embodiment of the present invention, for example, an aluminum oxide film is formed as the protective insulating film. Note that the aluminum oxide film is preferably formed by a sputtering method using a deposition gas containing oxygen.

In the method for manufacturing a semiconductor device of one embodiment of the present invention, for example, a silicon oxide film including an oxygen-excess region and an aluminum oxide film are formed in this order as the protective insulating film.

In the method for manufacturing a semiconductor device of one embodiment of the present invention, for example, a silicon oxide film including an oxygen-excess region is formed as the base insulating film.

In the method for manufacturing a semiconductor device of one embodiment of the present invention, for example, an oxide semiconductor film containing indium, gallium, and zinc is formed as the oxide semiconductor film In the method for manufacturing a semiconductor device of one embodiment of the present invention, for example, a base oxide semiconductor film is formed between the base insulating film and the oxide semiconductor film to be included in the stack. Note that an oxide semiconductor film containing indium, gallium, and zinc is preferably formed as the base oxide semiconductor film.

In the method for manufacturing a semiconductor device of one embodiment of the present invention, for example, a protective oxide semiconductor film over and in contact with the oxide semiconductor film is included in the stack. Note that an oxide semiconductor film containing indium, gallium, and zinc is preferably formed as the protective oxide semiconductor film.

A transistor with stable electric characteristics can be provided. A transistor with small variation in electrical characteristics can be provided. A miniaturized transistor can be provided. A transistor with a low off-state current can be provided. A transistor having a high on-state current can be provided.

A semiconductor device including the transistor can be provided. A highly integrated semiconductor device can be provided. A semiconductor device with high productivity can be provided. A semiconductor device with lower power consumption can be provided.

BRIEF DESCRIPTION OF THE DRAWINGS

FIGS. 3A1 to 3C2 are cross-sectional views illustrating an example of a method for manufacturing a semiconductor device of one embodiment of the present invention.

FIGS. 4A1 to 4C2 are cross-sectional views illustrating an examples of a method for manufacturing a semiconductor device of one embodiment of the present invention.

FIGS. 6A1 to 6C2 are cross-sectional views illustrating an example of a method for manufacturing a semiconductor device of one embodiment of the present invention.

FIGS. 7A to 7C are a top view and cross-sectional views illustrating an example of a semiconductor device of one embodiment of the present invention.

FIGS. 8A1 to 8C2 are cross-sectional views illustrating an example of a method for manufacturing a semiconductor device of one embodiment of the present invention.

FIGS. 9A1 to 9B2 are cross-sectional views illustrating an example of a method for manufacturing a semiconductor device of one embodiment of the present invention.

FIGS. 12A1 to 12C2 are cross-sectional views illustrating an example of a method for manufacturing a semiconductor device of one embodiment of the present invention.

FIGS. 13A1 to 13B2 are cross-sectional views illustrating an example of a method for manufacturing a semiconductor device of one embodiment of the present invention.

FIGS. 16A1 to 16C2 are cross-sectional views illustrating an example of a method for manufacturing a semiconductor device of one embodiment of the present invention.

FIGS. 17A1 to 17B2 are cross-sectional views illustrating an example of a method for manufacturing a semiconductor device of one embodiment of the present invention.

DETAILED DESCRIPTION OF THE INVENTION

Figure 1A:
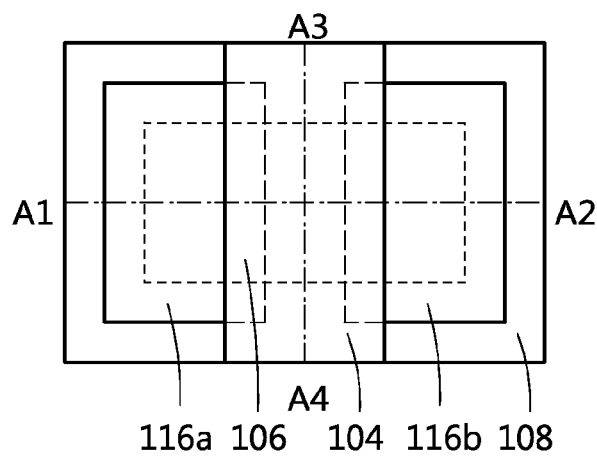
FIGS. 1A to 1C are a top view and cross-sectional views illustrating an example of a semiconductor device of one embodiment of the present invention.

Hereinafter, embodiments of the present invention are described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, description can be made even when "first" is replaced with "second" or "third", as appropriate. In addition, the ordinal numbers in this specification do not correspond to the ordinal numbers that specify one embodiment of the present invention in some cases.

Note that a "semiconductor" includes characteristics of an "insulator" in some cases when the conductivity is sufficiently low, for example. In addition, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Note that an impurity in a semiconductor film refers to, for example, elements other than the main components of a semiconductor film. For example, an element with a concentration of lower than 0.1 atomic % is an impurity. When an impurity is contained, density of states (DOS) may be formed in the semiconductor film, the carrier mobility may be decreased, or the crystallinity may be lowered, for example. In the case where the semiconductor film is an oxide semiconductor film, examples of an impurity which changes characteristics of the semiconductor film include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case where the semiconductor film is an oxide semiconductor film, oxygen vacancies may be formed by entry of impurities. Further, when the semiconductor film is a silicon film, examples of an impurity which changes the characteristics of the semiconductor film include oxygen, Group 1 elements except hydrogen, Group 2 elements, Group 13 elements, and Group 15 elements.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

<Transistor Structure (1)>

A transistor of one embodiment of the present invention is described with reference to FIGS. 1A to 1C and FIGS. 2A to 2C.

FIG. 1A is a top view of the transistor. Here, some films are not illustrated for easy understanding.

Figure 1C:
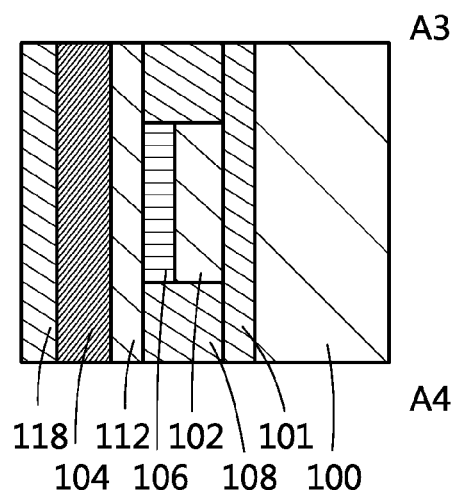
Figure 1B:
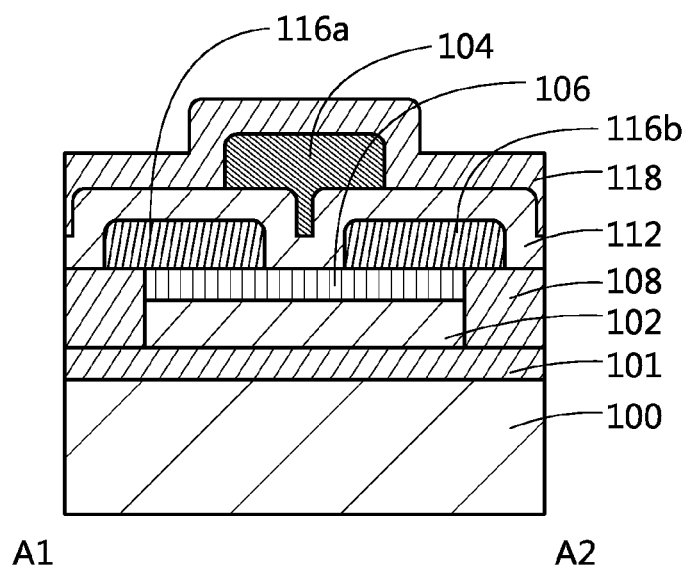

FIG. 1B is a cross-sectional view taken along dashed dotted line A1-A2 in FIG. 1A. FIG. 1C is a cross-sectional view taken along dashed-dotted line A3-A4 in FIG. 1A.

The transistor in FIGS. 1A to 1C includes an insulating film 101 over a substrate 100; an insulating film 102 over the insulating film 101; an oxide semiconductor film 106 over the insulating film 102; and an insulating film 108 that is provided over the insulating film 101 and in contact with the side surface of the insulating film 102 and the side surface of the oxide semiconductor film 106. Note that the top surface of the oxide semiconductor film 106 is positioned at substantially the same level as the top surface of the insulating film 108. Furthermore, the transistor in FIGS. 1A to 1C includes a conductive film 116a and a conductive film 116b that are over and in contact with at least the oxide semiconductor film 106 to be apart from each other; an insulating film 112 over the oxide semiconductor film 106, the conductive film 116a, and the conductive film 116b; a conductive film 104 over the insulating film 112; and an insulating film 118 over the insulating film 112 and the conductive film 104. Note that the transistor does not necessarily include all of the insulating film 101, the conductive film 116a, the conductive film 116b, and the insulating film 118.

In the transistor in FIGS. 1A to 1C, the conductive film 116a and the conductive film 116b function as a source electrode and a drain electrode. The insulating film 112 functions as a gate insulating film. The conductive film 104 functions as a gate electrode.

Note that although the side surface of each film included in the transistor in FIGS. 1A to 1C has a steep angle, one embodiment of the present invention is not limited to this shape. For example, the side surface of each film may have a tapered angle. For example, in the cross-sectional view, an inner angle (an angle inside a film) formed by a line passing through three or more points (points 3 nm or more away from one another) of a surface where the film is formed and a line passing through three or more points (points 3 nm or more away from one another) of the side surface of the film is greater than or equal to 70° and less than 90°, preferably greater than or equal to 80° and less than 90°, further preferably greater than or equal to 85° and less than 90°. The tapered angle within the above range can reduce the area of the transistor in the top view. In addition, although the top edge of each of the conductive film 116a, the conductive film 116b, the insulating film 112, the conductive film 104, and the insulating film 118 has a curvature, one embodiment of the present invention is not limited to this shape.

Although the insulating film 112 is provided over the oxide semiconductor film 106, the insulating film 108, the conductive film 116a, and the conductive film 116b in the cross-sectional view of the transistor in FIG. 1B, one embodiment of the present invention is not limited to this shape. For example, the insulating film 112 may be provided only in a region which overlaps the conductive film 104 in the top view of the transistor in FIG. 1A.

An sidewall insulating film may be provided in contact with the side surface of the conductive film 104. In the case where the sidewall insulating film is provided, the insulating film 112 may be provided only in a region which overlaps the conductive film 104 and the sidewall insulating film in the top view. Description of another insulating film is referred to for the sidewall insulating film.

For example, the insulating film 101 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

It is preferable to use an insulating film having an oxygen-blocking property as the insulating film 101. An example of the insulating film having an oxygen-blocking property is an insulating film having a small diffusion coefficient of oxygen.

The insulating film having an oxygen-blocking property has a smaller diffusion coefficient of oxygen (including an oxygen atom and a molecule including an oxygen atom) than, for example, a silicon oxide film. Therefore, the amount of oxygen which penetrates (passes through) the insulating film having an oxygen-blocking property is smaller than that which penetrates (passes through) a silicon oxide film. For example, the amount of oxygen which penetrates (passes through) the insulating film having an oxygen-blocking property is less than 20%, less than 15%, less than 10%, less than 5%, less than 2%, or less than 1% of the amount of oxygen which penetrates (passes through) the silicon oxide film.

It is preferable to use an insulating film having a hydrogen-blocking property as the insulating film 101. An example of the insulating film having a hydrogen-blocking property is an insulating film having a small diffusion coefficient of hydrogen.

The insulating film having a hydrogen-blocking property has a smaller diffusion coefficient of hydrogen (including an hydrogen atom and a molecule including an hydrogen atom) than, for example, a silicon oxide film. Therefore, the amount of hydrogen which penetrates (passes through) the insulating film having a hydrogen-blocking property is smaller than that which penetrates (passes through) a silicon oxide film. For example, the amount of hydrogen which penetrates (passes through) the insulating film having a hydrogen-blocking property is less than 20%, less than 15%, less than 10%, less than 5%, less than 2%, or less than 1% of the amount of hydrogen which penetrates (passes through) the silicon oxide film.

As the insulating film 101, an insulating film which releases a small amount of hydrogen is preferably used. The amount of released hydrogen can be measured by thermal desorption spectroscopy (TDS). The amount of a gas having a mass-to-charge ratio (m/z) of 2 which is released from the insulating film that releases a small amount of hydrogen is less than $1 \times 10^{15}/cm^2$, preferably less than $5 \times 10^{14}/cm^2$, further preferably less than $2 \times 10^{14}/cm^2$, still further preferably less than $1 \times 10^{14}/cm^2$ when measured by TDS analysis in which the sample temperature falls within 150° C. to 450° C.

For example, the insulating film 102 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

Furthermore, as the insulating film 102, an insulating film containing excess oxygen is used. An insulating film containing excess oxygen refers to an insulating film from which oxygen is released by heat treatment.

The insulating film containing excess oxygen is capable of reducing oxygen vacancy in the oxide semiconductor film 106. Such oxygen vacancy in the oxide semiconductor film 106 serves as a hole trap or the like. In addition, hydrogen enters into the site of such oxygen vacancy and in some cases forms an electron. Therefore, by reducing the oxygen vacancy in the oxide semiconductor film 106, the transistor can have stable electrical characteristics.

Here, a film from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ in TDS analysis (converted into the number of oxygen atoms) in the range of a surface temperature of 100° C. to 700° C. or 100° C. to 500° C.

Alternatively, the film from which oxygen is released by heat treatment may contain a peroxide radical. Specifically, the spin density attributed to the peroxide radical may be higher than or equal to $5 \times 10^{17}$ spins/cm$^3$. Note that the film containing a peroxide radical may have an asymmetric signal with a g factor of approximately 2.01 in electron spin resonance (ESR).

The insulating film containing excess oxygen may be oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry (RBS).

The insulating film 102 may be, for example, a stack including a silicon nitride film as a first layer and a silicon oxide film as a second layer. In that case, the silicon oxide film may be a silicon oxynitride film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon nitride film, a silicon nitride film which releases a small amount of hydrogen and ammonia is used. The amount of released hydrogen and ammonia may be measured by TDS analysis. Furthermore, as the silicon nitride film, a silicon nitride film which does not transmit or hardly transmits hydrogen, water, and oxygen is used.

Alternatively, the insulating film 102 may be, for example, a stack including a silicon nitride film as a first layer, a first silicon oxide film as a second layer, and a second silicon oxide film as a third layer. In that case, the first silicon oxide film and/or the second silicon oxide film may be a silicon oxynitride film. A silicon nitride oxide film may be used instead of the silicon nitride film. It is preferable to use a silicon oxide film whose defect density is small as the first silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide film, a silicon oxide film containing excess oxygen is used. As the silicon nitride film, a silicon nitride film which releases a small amount of hydrogen and ammonia is used. Further, as the silicon nitride film, a silicon nitride film which does not transmit or hardly transmits hydrogen, water, and oxygen is used.

Alternatively, the insulating film 102 may be a stack including an oxide semiconductor film. For the oxide semiconductor film, the oxide semiconductor film 106 described later is referred to.

The oxide semiconductor film 106 is described below.

The oxide semiconductor film 106 is an oxide containing indium. An oxide can have a high carrier mobility (electron mobility) by containing indium, for example. The oxide semiconductor film 106 preferably contains an element M. The element M is aluminum, gallium, yttrium, or tin, for example. The element M is an element having a high bonding energy with oxygen, for example. The element M is an element that can increase the energy gap of the oxide, for example. Furthermore, the oxide semiconductor film 106 preferably contains zinc. When the oxide contains zinc, the oxide is easily crystallized, for example. The energy of the top of the valence band in the oxide can be controlled with the atomic ratio of zinc, for example.

Note that the oxide semiconductor film 106 is not limited to the oxide containing indium. The oxide semiconductor film 106 may be, for example, a Zn—Sn oxide or a Ga—Sn oxide.

A first oxide semiconductor film and a second oxide semiconductor film may be provided over and under a channel formation region in the oxide semiconductor film 106. Note that the second oxide semiconductor film is provided to be closer to the conductive film 104 than the first oxide semiconductor is.

The first oxide semiconductor film and the second oxide semiconductor film each contain one or more elements that are not oxygen and are contained in the oxide semiconductor film 106. Since the first oxide semiconductor film and the second oxide semiconductor film contains one or more elements that are not oxygen and are contained in the oxide semiconductor film 106, an interface state is less likely to be formed at the interfaces between the oxide semiconductor film 106 and each of the first oxide semiconductor film and the second oxide semiconductor film.

In the case where the first oxide semiconductor film is an In-M-Zn oxide, when summation of In and M is assumed to be 100 atomic %, the proportions of In and M are preferably set to less than 50 atomic % and greater than or equal to 50 atomic %, respectively, and further preferably less than 25 atomic % and greater than or equal to 75 atomic %, respectively. In the case where the oxide semiconductor film 106 is an In-M-Zn oxide, when summation of In and M is assumed to be 100 atomic %, the proportions of In and M are preferably set to greater than or equal to 25 atomic % and less than 75 atomic %, respectively, and further preferably greater than or equal to 34 atomic % and less than 66 atomic %, respectively. In the case where the second oxide semiconductor film is an In-M-Zn oxide, when summation of In and M is assumed to be 100 atomic %, the proportions of In and M are preferably set to less than 50 atomic % and greater than or equal to 50 atomic %, respectively, and further preferably less than 25 atomic % and greater than or equal to 75 atomic %, respectively. Note that the second oxide semiconductor film may be formed using the same kind of oxide as that of the first oxide semiconductor film.

Here, in some cases, there is a mixed region of the first oxide semiconductor film and the oxide semiconductor film 106 between the first oxide semiconductor film and the oxide semiconductor film 106. Furthermore, in some cases, there is a mixed region of the oxide semiconductor film 106 and the second oxide semiconductor film between the oxide semiconductor film 106 and the second oxide semiconductor film. The mixed region has a low density of interface states. For that reason, the stack including the first oxide semiconductor film, the oxide semiconductor film 106, and the second oxide semiconductor film has a band structure where energy at each interface and in the vicinity of the interface is changed continuously (continuous junction).

As the oxide semiconductor film 106, an oxide having an electron affinity higher than those of the first oxide semiconductor film and the second oxide semiconductor film is used. For example, as the oxide semiconductor film 106, an oxide having an electron affinity higher than those of the first oxide semiconductor film and the second oxide semiconductor film by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the bottom of the conduction band.

In that case, when an electric field is applied to the conductive film 104, a channel is formed in the oxide semiconductor film 106, which has an electron affinity higher than those of the first oxide semiconductor film and the second oxide semiconductor film.

To increase the on-state current of the transistor, the thickness of the second oxide semiconductor film is preferably as small as possible. The thickness of the second oxide semiconductor film is less than 10 nm, preferably less than or equal to 5 nm, further preferably less than or equal to 3 nm, for example. Meanwhile, the second oxide semiconductor film has a function of blocking elements other than oxygen (such as silicon) contained in the insulating film 112 from entering the oxide semiconductor film 106 where a channel is formed. For this reason, the second oxide semiconductor film preferably has a certain degree of thickness. The thickness of the second oxide semiconductor film is greater than or equal to 0.3 nm, preferably greater than or equal to 1 nm, further preferably greater than or equal to 2 nm, for example.

To improve reliability, it is preferable that the thickness of the first oxide semiconductor film be large, the thickness of the oxide semiconductor film 106 be small, and the thickness of the second oxide semiconductor film be small. Specifically, the thickness of the first oxide semiconductor film is greater than or equal to 20 nm, preferably greater than or equal to 30 nm, further preferably greater than or equal to 40 nm, still further preferably greater than or equal to 60 nm. In that case, the distance from the interface between the insulating film 102 and the first oxide semiconductor film to the oxide semiconductor film 106 where the channel is formed can be greater than or equal to 20 nm, preferably greater than or equal to 30 nm, more preferably greater than or equal to 40 nm, still more preferably greater than or equal to 60 nm. Note that to prevent the productivity of the semiconductor device from being lowered, the thickness of the first oxide semiconductor film is less than or equal to 200 nm, preferably less than or equal to 120 nm, more preferably less than or equal to 80 nm. The thickness of the oxide semiconductor film 106 is greater than or equal to 3 nm and less than or equal to 100 nm, preferably greater than or equal to 3 nm and less than or equal to 80 nm, further preferably greater than or equal to 3 nm and less than or equal to 50 nm.

For example, the thickness of the first oxide semiconductor film may be larger than that of the oxide semiconductor film 106, and the thickness of the oxide semiconductor film 106 may be larger than that of the second oxide semiconductor film.

The influence of impurities in the oxide semiconductor film 106 is described below. In order that the transistor have stable electrical characteristics, it is effective to reduce the concentration of impurities in the oxide semiconductor film 106 so that the oxide semiconductor film 106 has a lower carrier density and is highly purified. The carrier density of the oxide semiconductor film 106 is lower than $1\times10^{17}/cm^3$, lower than $1\times10^{15}/cm^3$, or lower than $1\times10^{13}/cm^3$. In order to reduce the concentration of impurities in the oxide semiconductor film 106, the concentration of impurities in a film that is adjacent to the oxide semiconductor film 106 is also preferably reduced.

For example, silicon contained in the oxide semiconductor film 106 might serve as a carrier trap or a carrier generation source. Thus, the concentration of silicon in a region between the oxide semiconductor film 106 and the first oxide semiconductor film, which is measured by secondary ion mass spectrometry (SIMS), is set to lower than $1\times10^{19}$ atoms/cm$^3$, preferably lower than $5\times10^{18}$ atoms/cm$^3$, still further preferably lower than $2\times10^{18}$ atoms/cm$^3$. The concentration of silicon in a region between the oxide semiconductor film 106 and the second oxide semiconductor film, which is measured by SIMS, is set to lower than $1\times10^{19}$ atoms/cm$^3$, preferably lower than $5\times10^{18}$ atoms/cm$^3$, further preferably lower than $2\times10^{18}$ atoms/cm$^3$.

When hydrogen is contained in the oxide semiconductor film 106, carrier density might be increased. Therefore, the concentration of hydrogen in the oxide semiconductor film 106 measured by SIMS is set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor film 106, carrier density might be increased. The concentration of nitrogen in the oxide semiconductor film 106 measured by SIMS is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is also preferable to reduce the concentration of hydrogen in each of the first oxide semiconductor film and the second oxide semiconductor film in order to reduce the concentration of hydrogen in the oxide semiconductor film 106. The concentration of hydrogen in each of the first oxide semiconductor film and the second oxide semiconductor film measured by SIMS is lower than or equal to $2\times10^{20}$ atoms/cm$^3$, preferably lower than or equal to $5×10^{19}$ atoms/cm$^3$, further preferably lower than or equal to $1×10^{19}$ atoms/cm$^3$, still further preferably lower than or equal to $5×10^{18}$ atoms/cm$^3$. It is also preferable to reduce the concentration of nitrogen in each of the first oxide semiconductor film and the second oxide semiconductor film in order to reduce the concentration of nitrogen in the oxide semiconductor film 106. The concentration of nitrogen in each of the first oxide semiconductor film and the second oxide semiconductor film measured by SIMS is lower than $5×10^{19}$ atoms/cm$^3$, preferably lower than or equal to $5×10^{18}$ atoms/cm$^3$, further preferably lower than or equal to $1×10^{18}$ atoms/cm$^3$, still further preferably lower than or equal to $5×10^{17}$ atoms/cm$^3$.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. In addition, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. However, there is no regularity of crystal orientation between different crystal parts in the nc-OS film; hence, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

For example, the insulating film 108 illustrated in FIGS. 1A to 1C may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

It is preferable to use an insulating film having an oxygen-blocking property as the insulating film 108. Furthermore, it is preferable to use an insulating film containing excess oxygen as the insulating film 108. It is preferable to use an insulating film having a hydrogen-blocking property as the insulating film 108. It is preferable to use an insulating film which releases a small amount of hydrogen as the insulating film 108.

Figure 2A:
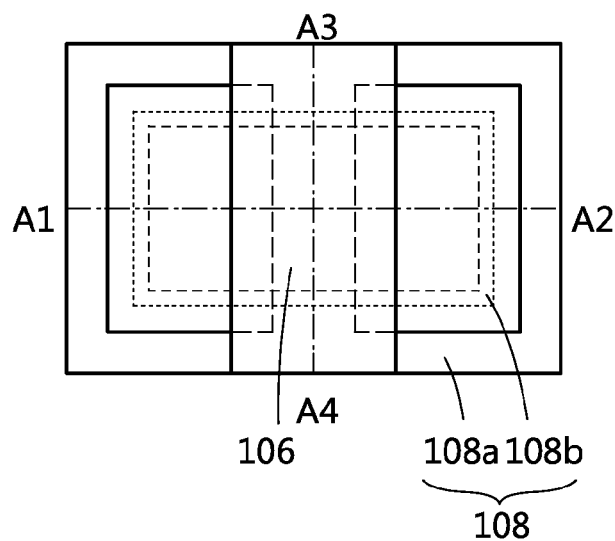
FIGS. 2A to 2C are a top view and cross-sectional views illustrating an example of a semiconductor device of one embodiment of the present invention.
Figure 2C:
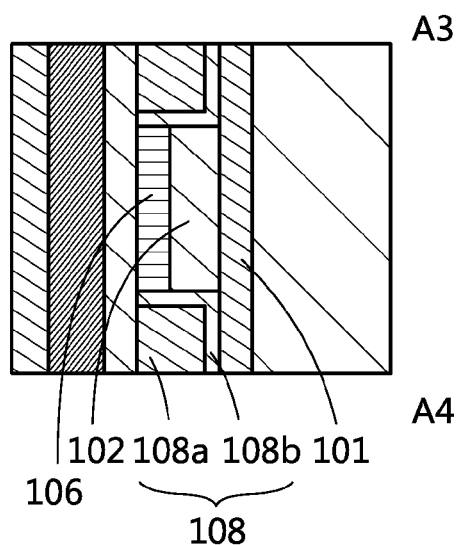
Figure 2B:
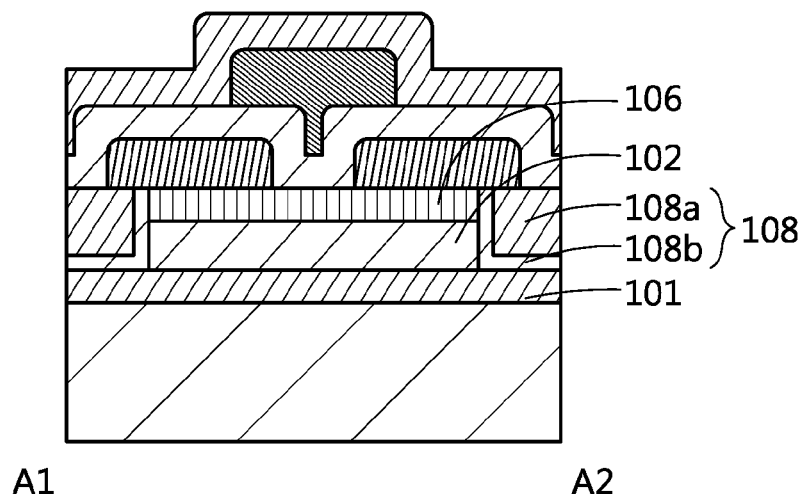

Note that as illustrated in FIGS. 2A to 2C, an insulating film 108a and an insulating film 108b may be used as the insulating film 108. The insulating film 108b is provided between the insulating film 108a and each of the insulating film 101, the insulating film 102, and the oxide semiconductor film 106.

For example, the insulating film 108a may be formed of a single layer or a stacked layer using an insulating film containing one or more of aluminum oxide, magnesium oxide, silicon nitride oxide, silicon nitride, gallium oxide, germanium oxide, yttrium oxide, zirconium oxide, lanthanum oxide, neodymium oxide, hafnium oxide, and tantalum oxide.

An insulating film having an oxygen-blocking property is used as the insulating film 108a. Furthermore, as the insulating film 108a, an insulating film containing excess oxygen is preferably used. An insulating film having a hydrogen-blocking property is preferably used as the insulating film 108a. An insulating film which releases a small amount of hydrogen is preferably used as the insulating film 108a.

The insulating film 108b is formed of, for example, a single layer or a stacked layer of an insulating film containing silicon oxide or silicon oxynitride. As the insulating film 108b, an insulating film containing excess oxygen is preferably used.

The conductive film 116a and the conductive film 116b illustrated in FIGS. 1A to 1C may be formed using a single layer or a stacked layer of a conductive film containing one or more of aluminum, titanium, chromium, cobalt, nickel, copper, yttrium, zirconium, molybdenum, ruthenium, silver, tantalum, and tungsten, for example.

For example, the insulating film 112 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

As the insulating film 112, an insulating film containing excess oxygen is preferably used.

The insulating film 112 may be, for example, a stack including a silicon nitride film as a first layer and a silicon oxide film as a second layer. In that case, the silicon oxide film may be a silicon oxynitride film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon oxide film, a silicon oxide film containing excess oxygen is preferably used. As the silicon nitride film, a silicon nitride film which releases a small amount of a hydrogen gas and a small amount of an ammonia gas is used. The amount of released hydrogen gas or ammonia gas may be measured by TDS.

The insulating film 112 may be a stack including an oxide semiconductor film. The description of the oxide semiconductor film 106 can be referred to for the oxide semiconductor film.

The conductive film 104 may be formed using a single layer or a stacked layer of a conductive film containing one or more of aluminum, titanium, chromium, cobalt, nickel, copper, yttrium, zirconium, molybdenum, ruthenium, silver, tantalum, and tungsten, for example.

For example, the insulating film 118 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

An insulating film having an oxygen-blocking property is preferably used as the insulating film 118. An insulating film having a hydrogen-blocking property is preferably used as the insulating film 118. An insulating film which releases a small amount of hydrogen is preferably used as the insulating film 118.

There is no large limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element may be used as the substrate 100.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

The transistor illustrated in FIGS. 1A to 1C is surrounded by the insulating films having an oxygen-blocking property. Moreover, the insulating film 102 containing excess oxygen can be surrounded by the insulating film 101, the insulating film 108, and the oxide semiconductor film 106. Therefore, even when oxygen vacancy is generated in the oxide semiconductor film 106, the excess oxygen contained in the insulating film 102 can effectively reduce the oxygen vacancy. In the same manner, even when oxygen vacancy is generated in the oxide semiconductor film 106, the excess oxygen contained in the insulating film 112 can effectively reduce the oxygen vacancy. That is, the transistor illustrated in FIGS. 1A to 1C has stable electrical characteristics. In addition, since an increase in off-state current due to oxygen vacancy can be inhibited, the off-state current of the transistor is low.

<Method for Manufacturing Transistor Structure (1)>

A method for manufacturing the transistor illustrated in FIGS. 1A to 1C is described below with reference to FIGS. 3A1 to 3C2 and FIGS. 4A1 to 4C2. The method for manufacturing the transistor is described to correspond to the cross-sectional views of FIGS. 1B and 1C.

First, the substrate 100 is prepared. Then, the gate insulating film 101 is formed (see FIGS. 3A1 and 3A2). The insulating film 101 may be formed using an insulating film selected from the insulating films given as examples of the insulating film 101. The insulating film 101 can be formed by a sputtering method, a chemical vapor deposition (CVD) method, a molecular beam epitaxy (MBE) method, an atomic layer deposition (ALD) method, or a pulsed laser deposition (PLD) method.

Next, an insulating film to be the insulating film 102 is formed. Note that the insulating film to be the insulating film 102 may be formed using an insulating film selected from the insulating films given as examples of the insulating film 102. The insulating film to be the insulating film 102 may be formed by a sputtering method, a CVD method, an MBE method, an ALD method, or a PLD method.

Then, an oxide semiconductor film to be the oxide semiconductor film 106 is formed. Note that the oxide semiconductor film to be the oxide semiconductor film 106 may be formed using an oxide semiconductor film selected from the oxide semiconductor films given as examples of the oxide semiconductor film 106. The oxide semiconductor film to be the oxide semiconductor film 106 can be formed by a sputtering method, a CVD method, an MBE method, an ALD method, or a PLD method, for example.

Then, a mask is formed over the oxide semiconductor film to be the oxide semiconductor film 106. Note that a resist and/or a hard mask may be used as the mask. The mask may be formed by a photolithography method or the like. The photolithography method can be performed using KrF excimer laser light, ArF excimer laser light, extreme ultraviolet (EUV) light, or the like. Immersion lithography, in which a space between a substrate and a projection lens is filled with liquid (e.g., water) and light exposure is performed, may be employed. An electron beam or an ion beam may be used instead of the irradiation light. Note that when an electron beam or an ion beam is used, a photomask is unnecessary.

Next, regions over which the mask is not provided in the insulating film to be the insulating film 102 and in the oxide semiconductor film to be the oxide semiconductor film 106 are etched to form the insulating film 102 and the oxide semiconductor film 106 (see FIGS. 3B1 and 3B2).

Next, an insulating film 107 is formed (see FIGS. 3C1 and 3C2). Note that the insulating film 107 is preferably formed to a thickness larger than the total thickness of the insulating film 102 and the oxide semiconductor film 106. The insulating film 107 may be formed using an insulating film selected from the insulating films described as examples of the insulating film 108. The insulating film 107 can be formed by a sputtering method, a CVD method, an MBE method, an ALD method, or a PLD method. The insulating film 107 is preferably formed using a sputtering method.

In the case where the insulating film 107 is formed by a sputtering method, a deposition gas containing oxygen is preferably used. With the deposition gas, oxygen can be added to the side surface of the insulating film 102 and the side surface and top surface of the oxide semiconductor film 106 at the time of forming the insulating film 107. The added oxygen serves as excess oxygen in the insulating film 102 and the oxide semiconductor film 106 and can be used to reduce oxygen vacancy in the oxide semiconductor film 106.

Next, the insulating film 107 is etched and planarized until the top surface of the oxide semiconductor film 106 is exposed, whereby the insulating film 108 is formed from the insulating film 107 (see FIGS. 4A1 and 4A2). As a way to etch and planarize the insulating film 107, a chemical mechanical polishing (CMP) method or the like may be used.

Note that in FIGS. 3C1 and 3C2, an insulating film to be the insulating film 108b and an insulating film to be the insulating film 108a may be formed as the insulating film 108. In this case, in FIGS. 4A1 and 4A2, the insulating film 107 is etched and planarized until the top surface of the oxide semiconductor film 106 is exposed, whereby the insulating film 108b and the insulating film 108a can be formed from the insulating film to be the insulating film 108b and the insulating film to be the insulating film 108a, respectively.

Next, a conductive film to be the conductive film 116a and the conductive film 116b is formed over the insulating film 108 and the oxide semiconductor film 106. Note that the conductive film to be the conductive film 116a and the conductive film 116b may be formed using a conductive film selected from the conductive films described as examples of the conductive film 116a and the conductive film 116b. The conductive film to be the conductive film 116a and the conductive film 116b may be formed by a sputtering method, a CVD method, an MBE method, an ALD method, or a PLD method.

Then, a mask is formed over the conductive film to be the conductive film 116a and the conductive film 116b. Note that a resist and/or a hard mask may be used as the mask. The mask may be formed by a photolithography method or the like. Next, regions over which the mask is not provided in the conductive film to be the conductive film 116a and the conductive film 116b are etched to form the conductive film 116a and the conductive film 116b (see FIGS. 4B1 and 4B2).

Next, the insulating film 112 is formed. Note that the insulating film 112 may be formed using an insulating film selected from the insulating films given as examples of the insulating film 112. The insulating film 112 can be formed by a sputtering method, a CVD method, an MBE method, an ALD method, or a PLD method.

Then, a conductive film to be the conductive film 104 is deposited. Note that the conductive film to be the conductive film 104 may be formed using a conductive film selected from the conductive films given as examples of the conductive film 104. The conductive film to be the conductive film 104 can be formed by a sputtering method, a CVD method, an MBE method, an ALD method, or a PLD method.

Next, a mask is formed over the conductive film to be the conductive film 104. Note that a resist and/or a hard mask may be used as the mask. The mask may be formed by a photolithography method or the like. Next, regions over which the mask is not provided in the conductive film to be the conductive film 104 are etched to form the conductive film 104.

Then, the insulating film 118 is formed. As a result, the transistor illustrated in FIGS. 1A to 1C can be manufactured (see FIGS. 4C1 and 4C2). Note that the insulating film 118 may be formed using an insulating film selected from the insulating films described as examples of the insulating film 118. The insulating film 118 can be formed by a sputtering method, a CVD method, an MBE method, an ALD method, or a PLD method.

Accordingly, a transistor having stable electric characteristics can be provided. Furthermore, a transistor with small variation in electrical characteristics can be provided. A miniaturized transistor can be provided. A transistor with low off-state current can be provided. A transistor having high on-state current can be provided.

In addition, a semiconductor device including the transistor can be provided. A highly integrated semiconductor device can be provided. A semiconductor device with high productivity can be provided. A semiconductor device with higher yield can be provided.

<Transistor Structure (2)>

A transistor of one embodiment of the present invention is described with reference to FIGS. 5A to 5C.

Figure 5A:
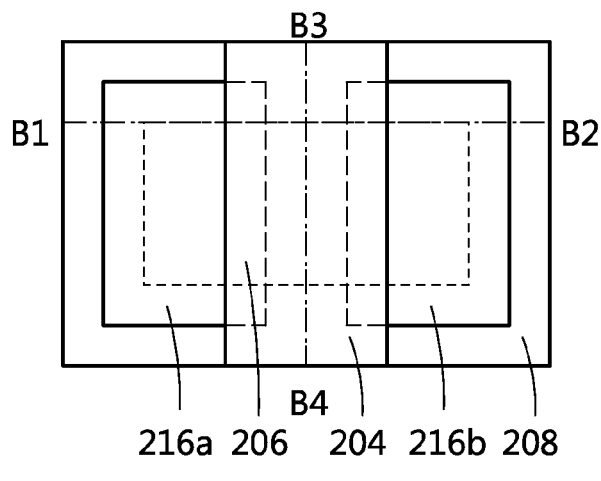
FIGS. 5A to 5C are a top view and cross-sectional views illustrating an example of a semiconductor device of one embodiment of the present invention.

FIG. 5A is a top view of the transistor. Here, some films are not illustrated for easy understanding.

Figure 5C:
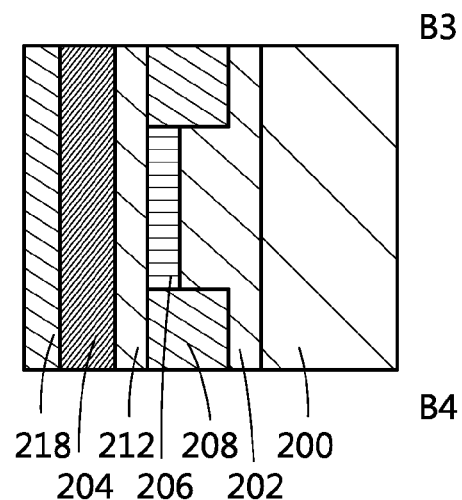
Figure 5B:
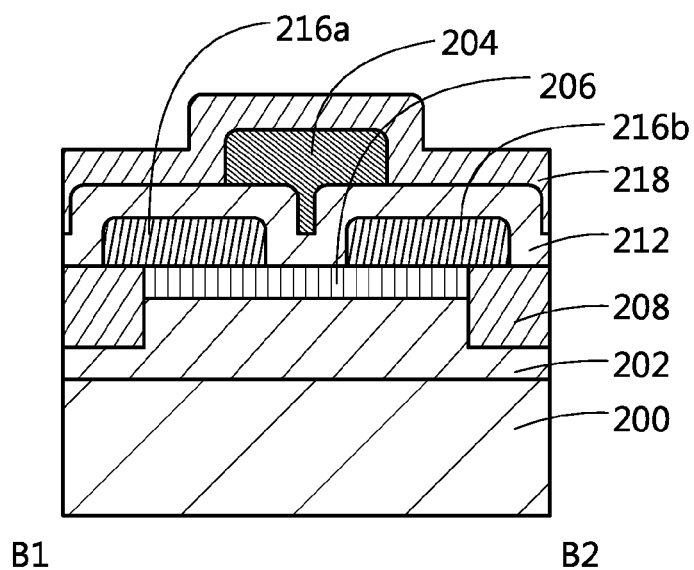

FIG. 5B is a cross-sectional view taken along dashed dotted line B1-B2 in FIG. 5A. FIG. 5C is a cross-sectional view taken along dashed-dotted line B3-B4 in FIG. 5A.

The transistor illustrated in FIGS. 5A to 5C includes an insulating film 202 over a substrate 200; an oxide semiconductor film 206 over the insulating film 202; and insulating film 208 in contact with part of the top surface of the insulating film 202, the side surface of the insulating film 202, and the side surface of the oxide semiconductor film 206. Note that the top surface of the oxide semiconductor film 206 is positioned at substantially the same level as the top surface of the insulating film 208. Furthermore, the transistor in FIGS. 5A to 5C includes a conductive film 216a and a conductive film 216b that are over and in contact with at least the oxide semiconductor film 206 to be apart from each other; an insulating film 212 over the oxide semiconductor film 206, the conductive film 216a, and the conductive film 216b; a conductive film 204 over the insulating film 212; and an insulating film 218 over the insulating film 212 and the conductive film 204. Note that the transistor does not necessarily include all of the conductive film 216a, the conductive film 216b, and the insulating film 218.

In the transistor in FIGS. 5A to 5C, the conductive film 216a and the conductive film 216b function as a source electrode and a drain electrode. The insulating film 212 functions as a gate insulating film. The conductive film 204 functions as a gate electrode.

Note that although the side surface of each film included in the transistor in FIGS. 5A to 5C has a steep angle, one embodiment of the present invention is not limited to this shape. For example, the side surface of each film may have a tapered angle. In addition, although the top edge of each of the conductive film 216a, the conductive film 216b, the insulating film 212, the conductive film 204, and the insulating film 218 has a curvature, one embodiment of the present invention is not limited to this shape.

Although the insulating film 212 is provided over the oxide semiconductor film 206, the insulating film 208, the conductive film 216a, and the conductive film 216b in the cross-sectional view of the transistor in FIG. 5B, one embodiment of the present invention is not limited to this shape. For example, the insulating film 212 may be provided only in a region which overlaps the conductive film 204 in the top view of the transistor in FIG. 5A.

An sidewall insulating film may be provided in contact with the side surface of the conductive film 204. In the case where the sidewall insulating film is provided, the insulating film 212 may be provided only in a region which overlaps the conductive film 204 and the sidewall insulating film in the top view. Description of another insulating film is referred to for the sidewall insulating film.

The description of the insulating film 102 can be referred to for the insulating film 202. An insulating film containing excess oxygen is used as the insulating film 202.

The description of the oxide semiconductor film 106 can be referred to for the oxide semiconductor film 206.

For the insulating film 208, the description of the insulating film 108 is referred to An insulating film having an oxygen-blocking property is used as the insulating film 208. As the insulating film 208, an insulating film containing excess oxygen is preferably used. An insulating film having a hydrogen-blocking property is preferably used as the insulating film 208. An insulating film which releases a small amount of hydrogen is preferably used as the insulating film 208.

Note that the insulating film 208 may be similar to the insulating film 108 including the insulating film 108a and the insulating film 108b illustrated in FIGS. 2A to 2C.

The description of the conductive film 116a and the conductive film 116b is referred to for the conductive film 216a and the conductive film 216b.

For the insulating film 212, the description of the insulating film 112 is referred to. As the insulating film 212, an insulating film containing excess oxygen is preferably used.

The description of the conductive film 104 is referred to for the conductive film 204.

For the insulating film 218, the description of the insulating film 218 is referred to. The insulating film 218 is preferably an insulating film having an oxygen-blocking property. An insulating film having a hydrogen-blocking property is preferably used as the insulating film 218. An insulating film which releases a small amount of hydrogen is preferably used as the insulating film 218.

For the substrate 200, the description of the substrate 100 is referred to.

The transistor illustrated in FIGS. 5A to 5C is surrounded by the insulating films having an oxygen-blocking property. For example, the insulating film 202 containing excess oxygen can be covered with the insulating film 208 and the oxide semiconductor film 206. Therefore, even when oxygen vacancy is generated in the oxide semiconductor film 206, the excess oxygen contained in the insulating film 202 can effectively reduce the oxygen vacancy. In the same manner, even when oxygen vacancy is generated in the oxide semiconductor film 206, the excess oxygen contained in the insulating film 212 can effectively reduce the oxygen vacancy. That is, the transistor illustrated in FIGS. 5A to 5C has stable electrical characteristics. In addition, since an increase in off-state current due to oxygen vacancy can be inhibited, the off-state current of the transistor is low.

<Method for Manufacturing Transistor Structure (2)>

A method for manufacturing the transistor illustrated in FIGS. 5A to 5C is described below with reference to FIGS. 6A1 to 6C2. The method for manufacturing the transistor is described to correspond to the cross-sectional views of FIGS. 5B and 5C.

First, the substrate 200 is prepared. Next, an insulating film 232 to be the insulating film 202 is formed. Note that the insulating film 232 may be formed using an insulating film selected from the insulating films described as examples of the insulating film 202. The insulating film 232 may be formed by a sputtering method, a CVD method, an MBE method, an ALD method, or a PLD method.

Next, an oxide semiconductor film 236 to be the oxide semiconductor film 206 is formed (see FIGS. 6A1 and 6A2). Note that the oxide semiconductor film 236 may be formed using an oxide semiconductor film selected from the oxide semiconductor films given as examples of the oxide semiconductor film 236. The oxide semiconductor film 236 can be formed by a sputtering method, a CVD method, an MBE method, an ALD method, or a PLD method.

Then, a mask is formed over the oxide semiconductor film to be the oxide semiconductor film 206. Note that a resist and/or a hard mask may be used as the mask. The mask may be formed by a photolithography method or the like.

Next, regions over which the mask is not provided in the insulating film 232 and in the oxide semiconductor film 236 are etched to form the insulating film 202 and the oxide semiconductor film 206 (see FIGS. 6B1 and 6B2).

Next, an insulating film to be the insulating film 208 is formed. Note that the insulating film to be the insulating film 208 is preferably formed to a thickness larger than the total thickness of the insulating film 202 and the oxide semiconductor film 206. The insulating film to be the insulating film 208 may be formed using an insulating film selected from the insulating films described as examples of the insulating film 208. The insulating film to be the insulating film 208 may be formed by a sputtering method, a CVD method, an MBE method, an ALD method, or a PLD method. The insulating film to be the insulating film 208 is preferably formed using a sputtering method.

In the case where the insulating film to be the insulating film 208 is formed by a sputtering method, a deposition gas containing oxygen is preferably used. With the deposition gas, oxygen can be added to part of the top surface of the insulating film 202, the side surface of the insulating film 202, and the side surface and top surface of the oxide semiconductor film 206 at the time of forming the insulating film to be the insulating film 208. The added oxygen serves as excess oxygen in the insulating film 202 and the oxide semiconductor film 206 and can be used to reduce oxygen vacancy in the oxide semiconductor film 206.

Next, the insulating film to be the insulating film 208 is etched and planarized until the top surface of the oxide semiconductor film 206 is exposed, whereby the insulating film 208 is formed from the insulating film to be the insulating film 208. As a way to etch and planarize the insulating film to be the insulating film 208, a CMP method or the like may be used.

Next, a conductive film to be the conductive film 216a and the conductive film 216b is formed. Note that the conductive film to be the conductive film 216a and the conductive film 216b may be formed using a conductive film selected from the conductive films described as examples of the conductive film 116a and the conductive film 116b. The conductive film to be the conductive film 216a and the conductive film 216b may be formed by a sputtering method, a CVD method, an MBE method, an ALD method, or a PLD method.

Then, a mask is formed over the conductive film to be the conductive film 216a and the conductive film 216b. Note that a resist and/or a hard mask may be used as the mask. The mask may be formed by a photolithography method or the like. Next, regions over which the mask is not provided in the conductive film to be the conductive film 216a and the conductive film 216b are etched to form the conductive film 216a and the conductive film 216b.

Next, the insulating film 212 is formed. Note that the insulating film 212 may be formed using an insulating film selected from the insulating films given as examples of the insulating film 212. The insulating film 212 can be formed by a sputtering method, a CVD method, an MBE method, an ALD method, or a PLD method.

Then, a conductive film to be the conductive film 204 is deposited. Note that the conductive film to be the conductive film 204 may be formed using a conductive film selected from the conductive films given as examples of the conductive film 204. The conductive film to be the conductive film 204 can be formed by a sputtering method, a CVD method, an MBE method, an ALD method, or a PLD method.

Next, a mask is formed over the conductive film to be the conductive film 204. Note that a resist and/or a hard mask may be used as the mask. The mask may be formed by a photolithography method or the like. Next, regions over which the mask is not provided in the conductive film to be the conductive film 204 are etched to form the conductive film 204.

Then, the insulating film 218 is formed. As a result, the transistor illustrated in FIGS. 5A to 5C can be manufactured (see FIGS. 6C1 and 6C2). Note that the insulating film 218 may be formed using an insulating film selected from the insulating films described as examples of the insulating film 218. The insulating film 218 can be formed by a sputtering method, a CVD method, an MBE method, an ALD method, or a PLD method.

Accordingly, a transistor having stable electric characteristics can be provided. Furthermore, a transistor with small variation in electrical characteristics can be provided. A miniaturized transistor can be provided. A transistor with low off-state current can be provided. A transistor having high on-state current can be provided.

In addition, a semiconductor device including the transistor can be provided. A highly integrated semiconductor device can be provided. A semiconductor device with high productivity can be provided. A semiconductor device with higher yield can be provided.

<Transistor Structure (3)>

A transistor of one embodiment of the present invention is described with reference to FIGS. 7A to 7C.

FIG. 7A is a top view of the transistor. Here, some films are not illustrated for easy understanding.

FIG. 7B is a cross-sectional view taken along dashed dotted line C1-C2 in FIG. 7A. FIG. 7C is a cross-sectional view taken along dashed-dotted line C3-C4 in FIG. 7A.

The transistor in FIGS. 7A to 7C includes an insulating film 301 over a substrate 300; an insulating film 302 over the insulating film 301; an oxide semiconductor film 306 over the insulating film 302; and an insulating film 308 that is provided over the insulating film 301 and in contact with the side surface of the insulating film 302 and the side surface of the oxide semiconductor film 306. Note that the top surface of the insulating film 308 is positioned at a higher level than the top surface of the oxide semiconductor film 306. Furthermore, the transistor in FIGS. 7A to 7C includes a conductive film 316a and a conductive film 316b that are over and in contact with at least the oxide semiconductor film 306 to be apart from each other; an insulating film 312 over the oxide semiconductor film 306, the conductive film 316a, and the conductive film 316b; a conductive film 304 over the insulating film 312; and an insulating film 318 over the insulating film 312 and the conductive film 304. Note that the transistor does not necessarily include all of the insulating film 301, the conductive film 316a, the conductive film 316b, and the insulating film 318.

Note that the transistor illustrated in FIGS. 7A to 7C may have a structure in which the insulating film 301 is not provided and the insulating film 302 is in contact with the bottom surface of the insulating film 308, in a manner similar to that of the transistor illustrated in FIGS. 5A to 5C.

In the transistor in FIGS. 7A to 7C, the conductive film 316a and the conductive film 316b function as a source electrode and a drain electrode. The insulating film 312 functions as a gate insulating film. The conductive film 304 functions as a gate electrode.

Note that although the side surface of each film included in the transistor in FIGS. 7A to 7C has a steep angle, one embodiment of the present invention is not limited to this shape. For example, the side surface of each film may have a tapered angle. In addition, although the top edge of each of the conductive film 316a, the conductive film 316b, the insulating film 312, the conductive film 304, and the insulating film 318 has a curvature, one embodiment of the present invention is not limited to this shape.

Although the insulating film 312 is provided over the oxide semiconductor film 306, the insulating film 308, the conductive film 316a, and the conductive film 316b in the cross-sectional view of the transistor in FIG. 7B, one embodiment of the present invention is not limited to this shape. For example, the insulating film 312 may be provided only in a region which overlaps the conductive film 304 in the top view of the transistor in FIG. 7A.

An sidewall insulating film may be provided in contact with the side surface of the conductive film 304. In the case where the sidewall insulating film is provided, the insulating film 312 may be provided only in a region which overlaps the conductive film 304 and the sidewall insulating film in the top view. Description of another insulating film is referred to for the sidewall insulating film.

For the insulating film 301, the description of the insulating film 101 is referred to. It is preferable to use an insulating film having an oxygen-blocking property as the insulating film 301. An example of the insulating film having an oxygen-blocking property is an insulating film having a small diffusion coefficient of oxygen.

The description of the insulating film 102 can be referred to for the insulating film 302. Further, an insulating film containing excess oxygen is used as the insulating film 302. An insulating film containing excess oxygen refers to an insulating film from which oxygen is released by heat treatment.

The description of the oxide semiconductor film 106 can be referred to for the oxide semiconductor film 306.

For the insulating film 308, the description of the insulating film 108 is referred to An insulating film having an oxygen-blocking property is used as the insulating film 308. As the insulating film 308, an insulating film containing excess oxygen is preferably used. An insulating film having a hydrogen-blocking property is preferably used as the insulating film 308. An insulating film which releases a small amount of hydrogen is preferably used as the insulating film 308.

Note that the insulating film 308 may be similar to the insulating film 108 including the insulating film 108a and the insulating film 108b illustrated in FIGS. 2A to 2C.

The description of the conductive film 116a and the conductive film 116b is referred to for the conductive film 316a and the conductive film 316b.

The description of the insulating film 112 can be referred to for the insulating film 312. As the insulating film 312, an insulating film containing excess oxygen is preferably used.

The description of the conductive film 104 is referred to for the conductive film 304.

For the insulating film 318, the description of the insulating film 118 is referred to. The insulating film 318 is preferably an insulating film having an oxygen-blocking property. An insulating film having a hydrogen-blocking property is preferably used as the insulating film 318. An insulating film which releases a small amount of hydrogen is preferably used as the insulating film 318.

For the substrate 300, the description of the substrate 100 is referred to.

The transistor illustrated in FIGS. 7A to 7C is surrounded by the insulating films having an oxygen-blocking property. For example, the insulating film 302 containing excess oxygen can be surrounded by the insulating film 301, the insulating film 308, and the oxide semiconductor film 306. Therefore, even when oxygen vacancy is generated in the oxide semiconductor film 306, the excess oxygen contained in the insulating film 302 can effectively reduce the oxygen vacancy. In the same manner, even when oxygen vacancy is generated in the oxide semiconductor film 306, the excess oxygen contained in the insulating film 312 can effectively reduce the oxygen vacancy. That is, the transistor illustrated in FIGS. 7A to 7C has stable electrical characteristics. In addition, since an increase in off-state current due to oxygen vacancy can be inhibited, the off-state current of the transistor is low.

<Method for Manufacturing Transistor Structure (3)>

A method for manufacturing the transistor illustrated in FIGS. 7A to 7C is described below with reference to FIGS. 8A1 to 8C2 and FIGS. 9A1 to 9B2. The method for manufacturing the transistor is described to correspond to the cross-sectional views of FIGS. 7B and 7C.

First, the substrate 300 is prepared. Next, the insulating film 301 is formed. Note that the insulating film 301 may be formed using an insulating film selected from the insulating films described as examples of the insulating film 301. The insulating film 301 may be formed by a sputtering method, a CVD method, an MBE method, an ALD method, or a PLD method.

Next, an insulating film 332 to be the insulating film 302 is formed. Note that the insulating film 332 may be formed using an insulating film selected from the insulating films given as examples of the insulating film 302. The insulating film to be the insulating film 302 can be formed by a sputtering method, a CVD method, an MBE method, an ALD method, or a PLD method.

Next, an oxide semiconductor film 336 to be the oxide semiconductor film 306 is formed. Note that the oxide semiconductor film 336 may be formed using an oxide semiconductor film selected from the oxide semiconductor films given as examples of the insulating film 306. The oxide semiconductor film to be the oxide semiconductor film 306 can be formed by a sputtering method, a CVD method, an MBE method, an ALD method, or a PLD method, for example.

Next, a hard mask 340 is formed over the oxide semiconductor film 336. The hard mask 340 is formed using a substance which is etched to an extent similar to that of the insulating film 308 formed later or is not easily etched as compared to the insulating film 308 by a CMP method. Furthermore, the hard mask 340 is formed using a substance which can be used as a mask at the time of etching the insulating film 332 and the oxide semiconductor film 336.

Then, a mask 350 is formed over the hard mask 340 (see FIGS. 8A1 and 8A2). Note that a resist may be used for the mask 350. The mask 350 may be formed by a photolithography method or the like.

Then, a region over which the mask 350 is not provided in the hard mask 340 is etched to form a hard mask 310.

Next, regions over which the hard mask 310 is not provided in the insulating film 302 and in the oxide semiconductor film 336 are etched to form the insulating film 302 and the oxide semiconductor film 306 (see FIGS. 8B1 and 8B2).

Next, an insulating film to be the insulating film 308 is formed. Note that the insulating film to be the insulating film 308 is preferably formed to a thickness larger than the total thickness of the insulating film 302, the oxide semiconductor film 306, and the hard mask 310. The insulating film to be the insulating film 308 may be formed using an insulating film selected from the insulating films described as examples of the insulating film 308. The insulating film to be the insulating film 308 may be formed by a sputtering method, a CVD method, an MBE method, an ALD method, or a PLD method. The insulating film to be the insulating film 308 is preferably formed using a sputtering method.

In the case where the insulating film to be the insulating film 308 is formed by a sputtering method, a deposition gas containing oxygen is preferably used. With the deposition gas, oxygen can be added to the side surface of the insulating film 302, and the side surface and top surface of the oxide semiconductor film 306 at the time of forming the insulating film to be the insulating film 308. The added oxygen serves as excess oxygen in the insulating film 302 and the oxide semiconductor film 306 and can be used to reduce oxygen vacancy in the oxide semiconductor film 306.

Next, the insulating film to be the insulating film 308 is etched and planarized until the top surface of the hard mask 310 is exposed, whereby the insulating film 308 is formed from the insulating film to be the insulating film 308 (see FIGS. 8C1 and 8C2). The hard mask 310 functions as an etching stopper; therefore, the insulating film to be the insulating film 308 can be prevented from being etched excessively and the oxide semiconductor film 306 can be prevented from being thinned or from disappearing. Accordingly, the transistors with small variation in the plane of the substrate can be manufactured. Furthermore, the transistors with high yield can be manufactured. Therefore, the etching rate can be increased while the insulating film to be the insulating film 308 is planarized, so that productivity of the transistors can be increased. As a way to etch and planarize the insulating film to be the insulating film 308, a CMP method or the like may be used.

Next, the hard mask 310 is removed (see FIGS. 9A1 and 9A2). As a result of such a process, the top surface of the insulating film 308 is positioned at a higher level than the top surface of the oxide semiconductor film 306. Furthermore, the hard mask 310 can reduce damage to the oxide semiconductor film 306 at the time of etching and planarizing the insulating film to be the insulating film 308. Thus, the transistor having stable electrical characteristics is easily obtained.

Next, a conductive film to be the conductive film 316a and the conductive film 316b is formed. Note that the conductive film to be the conductive film 316a and the conductive film 316b may be formed using a conductive film selected from the conductive films described as examples of the conductive film 116a and the conductive film 116b. The conductive film to be the conductive film 316a and the conductive film 316b may be formed by a sputtering method, a CVD method, an MBE method, an ALD method, or a PLD method.

Then, a mask is formed over the conductive film to be the conductive film 316a and the conductive film 316b. Note that a resist and/or a hard mask may be used as the mask. The mask may be formed by a photolithography method or the like. Next, regions over which the mask is not provided in the conductive film to be the conductive film 316a and the conductive film 316b are etched to form the conductive film 316a and the conductive film 316b.

Next, the insulating film 312 is formed. Note that the insulating film 312 may be formed using an insulating film selected from the insulating films given as examples of the insulating film 312. The insulating film 312 can be formed by a sputtering method, a CVD method, an MBE method, an ALD method, or a PLD method.

Then, a conductive film to be the conductive film 304 is deposited. Note that the conductive film to be the conductive film 304 may be formed using a conductive film selected from the conductive films given as examples of the conductive film 304. The conductive film to be the conductive film 304 can be formed by a sputtering method, a CVD method, an MBE method, an ALD method, or a PLD method.

Next, a mask is formed over the conductive film to be the conductive film 304. Note that a resist and/or a hard mask may be used as the mask. The mask may be formed by a photolithography method or the like. Next, regions over which the mask is not provided in the conductive film to be the conductive film 304 are etched to form the conductive film 304.

Then, the insulating film 318 is formed. As a result, the transistor illustrated in FIGS. 7A to 7C can be manufactured (see FIGS. 9B1 and 9B2). Note that the insulating film 318 may be formed using an insulating film selected from the insulating films described as examples of the insulating film 318. The insulating film 318 can be formed by a sputtering method, a CVD method, an MBE method, an ALD method, or a PLD method.

Accordingly, a transistor having stable electric characteristics can be provided. Furthermore, a transistor with small variation in electrical characteristics can be provided. A miniaturized transistor can be provided. A transistor with low off-state current can be provided. A transistor having high on-state current can be provided.

In addition, a semiconductor device including the transistor can be provided. A highly integrated semiconductor device can be provided. A semiconductor device with high productivity can be provided. A semiconductor device with higher yield can be provided.

<Transistor Structure (4)>

A transistor of one embodiment of the present invention is described with reference to FIGS. 10A to 10C and FIGS. 11A to 11C.

Figure 10A:
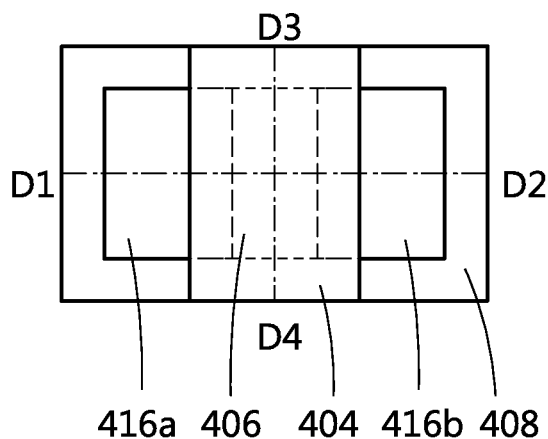
FIGS. 10A to 10C are a top view and cross-sectional views illustrating an example of a semiconductor device of one embodiment of the present invention.

FIG. 10A is a top view of the transistor. Here, some films are not illustrated for easy understanding.

Figure 10C:
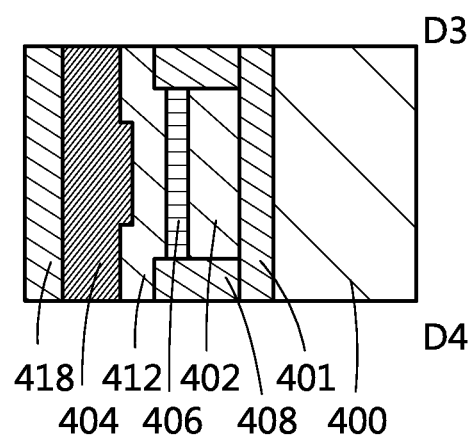
Figure 10B:
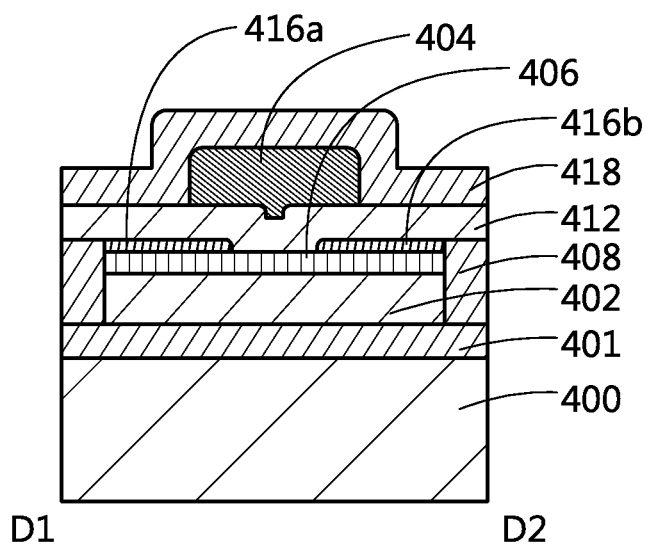

FIG. 10B is a cross-sectional view taken along dashed dotted line D1-D2 in FIG. 10A. FIG. 10C is a cross-sectional view taken along dashed-dotted line D3-D4 in FIG. 10A.

The transistor in FIGS. 10A to 10C includes an insulating film 401 over a substrate 400; an insulating film 402 over the insulating film 401; an oxide semiconductor film 406 over the insulating film 402; and an insulating film 408 that is provided over the insulating film 401 and in contact with the side surface of the insulating film 402 and the side surface of the oxide semiconductor film 406. Note that the top surface of the insulating film 408 is positioned at a higher level than the top surface of the oxide semiconductor film 406. Moreover, the transistor illustrated in FIGS. 10A to 10C includes a conductive film 416a and a conductive film 416b which are over and in contact with at least the oxide semiconductor film 406 and apart from each other and whose top surfaces are positioned at the same level as the top surface of the insulating film 408; an insulating film 412 over the oxide semiconductor film 406, the conductive film 416a, and the conductive film 416b; a conductive film 404 over the insulating film 412; and an insulating film 418 over the insulating film 412 and the conductive film 404. Note that the transistor does not necessarily include all of the insulating film 401, the conductive film 416a, the conductive film 416b, and the insulating film 418.

In the top view of the transistor in FIG. 10A, the region where the conductive film 416a and the conductive film 416b are provided can be positioned on the inside of the region where the oxide semiconductor film 406 is provided. Therefore, the area of the transistor in the top view can be smaller than those of the transistors in the top views of FIGS. 1A to 1C, FIGS. 2A to 2C, FIGS. 5A to 5C, and FIGS. 7A to 7C. Therefore, the transistor having a reduced size can be obtained.

Note that the transistor illustrated in FIGS. 10A to 10C may have a structure in which the insulating film 401 is not provided and the insulating film 402 is in contact with the bottom surface of the insulating film 408, in a manner similar to that of the transistor illustrated in FIGS. 5A to 5C.

In the transistor in FIGS. 10A to 10C, the conductive film 416a and the conductive film 416b function as a source electrode and a drain electrode. The insulating film 412 functions as a gate insulating film. The conductive film 404 functions as a gate electrode.

Note that although the side surface of each film included in the transistor in FIGS. 10A to 10C has a steep angle, one embodiment of the present invention is not limited to this shape. For example, the side surface of each film may have a tapered angle. In addition, although the top edge of each of the conductive film 416a, the conductive film 416b, the insulating film 412, the conductive film 404, and the insulating film 418 has a curvature, one embodiment of the present invention is not limited to this shape.

Although the insulating film 412 is provided over the oxide semiconductor film 406, the insulating film 408, the conductive film 416a, and the conductive film 416b in the cross-sectional view of the transistor in FIG. 10B, one embodiment of the present invention is not limited to this shape. For example, the insulating film 412 may be provided only in a region which overlaps the conductive film 404 in the top view of the transistor in FIG. 10A.

An sidewall insulating film may be provided in contact with the side surface of the conductive film 404. In the case where the sidewall insulating film is provided, the insulating film 412 may be provided only in a region which overlaps the conductive film 404 and the sidewall insulating film in the top view. Description of another insulating film is referred to for the sidewall insulating film.

For the insulating film 401, the description of the insulating film 101 is referred to. It is preferable to use an insulating film having an oxygen-blocking property as the insulating film 401. An example of the insulating film having an oxygen-blocking property is an insulating film having a small diffusion coefficient of oxygen.

The description of the insulating film 102 can be referred to for the insulating film 402. Further, an insulating film containing excess oxygen is used as the insulating film 402. An insulating film containing excess oxygen refers to an insulating film from which oxygen is released by heat treatment.

The description of the oxide semiconductor film 106 can be referred to for the oxide semiconductor film 406.

For the insulating film 408, the description of the insulating film 108 is referred to An insulating film having an oxygen-blocking property is used as the insulating film 408. As the insulating film 408, an insulating film containing excess oxygen is preferably used. An insulating film having a hydrogen-blocking property is preferably used as the insulating film 408. An insulating film which releases a small amount of hydrogen is preferably used as the insulating film 408.

Note that the insulating film 408 may be similar to the insulating film 108 including the insulating film 108a and the insulating film 108b illustrated in FIGS. 2A to 2C.

The description of the conductive film 116a and the conductive film 116b is referred to for the conductive film 416a and the conductive film 416b.

The description of the insulating film 112 can be referred to for the insulating film 412. As the insulating film 412, an insulating film containing excess oxygen is preferably used.

The description of the conductive film 104 is referred to for the conductive film 404.

For the insulating film 418, the description of the insulating film 118 is referred to. The insulating film 418 is preferably an insulating film having an oxygen-blocking property. An insulating film having a hydrogen-blocking property is preferably used as the insulating film 418. An insulating film which releases a small amount of hydrogen is preferably used as the insulating film 418.

For the substrate 400, the description of the substrate 100 is referred to.

Note that in the case where the conductive film functioning as a gate electrode is provided with a sidewall insulating film, the transistor in FIGS. 10A to 10C can be further reduced in size. An example of a transistor obtained by reduction of the size of the transistor illustrated in FIGS. 10A to 10C is described below with reference to FIGS. 11A to 11C.

Figure 11A:
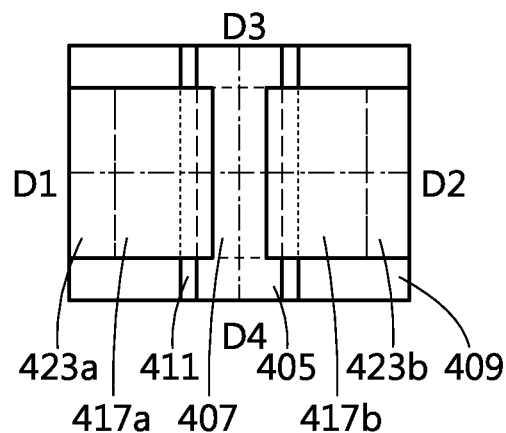
FIGS. 11A to 11C are a top view and cross-sectional views illustrating an example of a semiconductor device of one embodiment of the present invention.

FIG. 11A is a top view of the transistor. Here, some films are not illustrated for easy understanding.

Figure 11C:
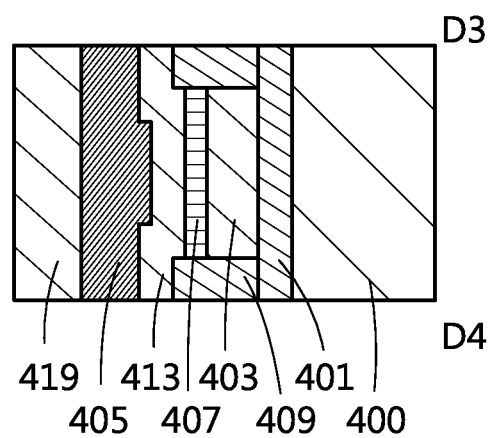
Figure 11B:
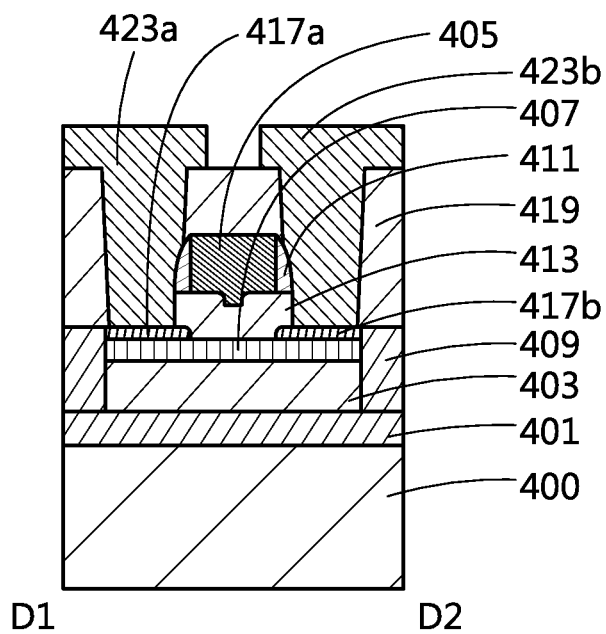

FIG. 11B is a cross-sectional view taken along dashed dotted line D1-D2 in FIG. 11A. FIG. 11C is a cross-sectional view taken along dashed-dotted line D3-D4 in FIG. 11A.

The transistor in FIGS. 11A to 11C includes the insulating film 401 over the substrate 400; an insulating film 403 over the insulating film 401; an oxide semiconductor film 407 over the insulating film 403; and an insulating film 409 that is provided over the insulating film 401 and in contact with the side surface of the insulating film 403 and the side surface of the oxide semiconductor film 407. Note that the top surface of the insulating film 409 is positioned at a higher level than the top surface of the oxide semiconductor film 407. Moreover, the transistor illustrated in FIGS. 11A to 11C includes a conductive film 417a and a conductive film 417b which are over and in contact with at least the oxide semiconductor film 407 and apart from each other and whose top surfaces are positioned at the same level as the top surface of the insulating film 409; an insulating film 413 over the oxide semiconductor film 407, the conductive film 417a, and the conductive film 417b; a conductive film 405 over the insulating film 413; an insulating film 411 in contact with the side surface of the conductive film 405; an insulating film 419 over the insulating film 413, the conductive film 405, and the insulating film 411; and a conductive film 423a and a conductive film 423b which are connected to the conductive film 417a and the conductive film 417b, respectively, through openings in the insulating film 419. Note that the transistor does not necessarily include all of the insulating film 401, the conductive film 417a, and the conductive film 417b.

Note that the insulating film 403 is the same as the insulating film 402 except for the shape; therefore, description thereof is omitted. Note that the oxide semiconductor film 407 is the same as the oxide semiconductor film 406 except for the shape; therefore, description thereof is omitted. Note that the insulating film 409 is the same as the insulating film 408 except for the shape; therefore, description thereof is omitted. Note that the conductive film 417a and the conductive film 417b are the same as the conductive film 416a and the conductive film 416b except for the shape; therefore, description thereof is omitted. Note that the insulating film 413 is the same as the insulating film 412 except for the shape; therefore, description thereof is omitted. Note that the conductive film 405 is the same as the conductive film 404 except for the shape; therefore, description thereof is omitted.

The insulating film 419 functions as an interlayer insulating film. The insulating film 411 functions as a sidewall insulating film of the conductive film 405. The conductive film 423a and the conductive film 423b function as wirings.

For example, the insulating film 419 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

For example, the insulating film 411 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

For example, the conductive film 423a and the conductive film 423b may be formed using a single layer or a stacked layer of a conductive film containing one or more of aluminum, titanium, chromium, cobalt, nickel, copper, yttrium, zirconium, molybdenum, ruthenium, silver, tantalum, and tungsten, for example.

The transistor in FIGS. 11A to 11C has a structure in which the insulating film 411 prevents the conductive film 405 from being in contact with the conductive film 423a and the conductive film 423b. Therefore, the conductive film 405 can be provided to be close to the conductive film 423a and the conductive film 423b; thus, the structure in FIGS. 11A to 11C is more suitable for reducing the size than the structure in FIGS. 10A to 10C.

The transistor illustrated in FIGS. 10A to 10C is surrounded by the insulating films having an oxygen-blocking property. For example, the insulating film 402 containing excess oxygen can be surrounded by the insulating film 401, the insulating film 408, and the oxide semiconductor film 406. Therefore, even when oxygen vacancy is generated in the oxide semiconductor film 406, the excess oxygen contained in the insulating film 402 can effectively reduce the oxygen vacancy. In the same manner, even when oxygen vacancy is generated in the oxide semiconductor film 406, the excess oxygen contained in the insulating film 412 can effectively reduce the oxygen vacancy. That is, the transistor illustrated in FIGS. 10A to 10C has stable electrical characteristics. In addition, since an increase in off-state current due to oxygen vacancy can be inhibited, the off-state current of the transistor is low.

<Method for Manufacturing Transistor Structure (4)>

A method for manufacturing the transistor illustrated in FIGS. 10A to 10C is described below with reference to FIGS. 12A1 to 12C2 and FIGS. 13A1 to 13B2. The method for manufacturing the transistor is described to correspond to the cross-sectional views of FIGS. 10B and 10C.

First, the substrate 400 is prepared. Next, the insulating film 401 is formed. Note that the insulating film 401 may be formed using an insulating film selected from the insulating films described as examples of the insulating film 401. The insulating film 401 may be formed by a sputtering method, a CVD method, an MBE method, an ALD method, or a PLD method.

Next, an insulating film 432 to be the insulating film 402 is formed. Note that the insulating film 432 may be formed using an insulating film selected from the insulating films given as examples of the insulating film 402. The insulating film to be the insulating film 402 can be formed by a sputtering method, a CVD method, an MBE method, an ALD method, or a PLD method.

Then, an oxide semiconductor film 436 to be the oxide semiconductor film 406 is deposited. Note that the oxide semiconductor film 436 may be formed using an oxide semiconductor film selected from the oxide semiconductor films given as examples of the oxide semiconductor film 406. The oxide semiconductor film to be the oxide semiconductor film 406 can be formed by a sputtering method, a CVD method, an MBE method, an ALD method, or a PLD method.

Next, a hard mask 440 is formed over the oxide semiconductor film 436. The hard mask 440 is formed using a conductive film which is etched to an extent similar to that of the insulating film 408 formed later or is not easily etched as compared to the insulating film 408 by a CMP method. Furthermore, the hard mask 440 is formed using a conductive film which can be used as a mask at the time of etching the insulating film 432 and the oxide semiconductor film 436.

Then, a mask 450 is formed over the hard mask 440 (see FIGS. 12A1 and 12A2). Note that a resist may be used for the mask 450. The mask 450 may be formed by a photolithography method or the like.

Then, a region over which the mask 450 is not provided in the hard mask 440 is etched to form a hard mask 410.

Next, regions over which the hard mask 410 is not provided in the insulating film 402 and in the oxide semiconductor film 436 are etched to form the insulating film 402 and the oxide semiconductor film 406 (see FIGS. 12B1 and 12B2).

Next, an insulating film to be the insulating film 408 is formed. Note that the insulating film to be the insulating film 408 is preferably formed to a thickness larger than the total thickness of the insulating film 402, the oxide semiconductor film 406, and the hard mask 410. The insulating film to be the insulating film 408 may be formed using an insulating film selected from the insulating films described as examples of the insulating film 408. The insulating film to be the insulating film 408 may be formed by a sputtering method, a CVD method, an MBE method, an ALD method, or a PLD method. The insulating film to be the insulating film 408 is preferably formed using a sputtering method.

In the case where the insulating film to be the insulating film 408 is formed by a sputtering method, a deposition gas containing oxygen is preferably used. With the deposition gas, oxygen can be added to the side surface of the insulating film 402, and the side surface and top surface of the oxide semiconductor film 406 at the time of forming the insulating film to be the insulating film 408. The added oxygen serves as excess oxygen in the insulating film 402 and the oxide semiconductor film 406 and can be used to reduce oxygen vacancy in the oxide semiconductor film 406.

Next, the insulating film to be the insulating film 408 is etched and planarized until the top surface of the hard mask 410 is exposed, whereby the insulating film 408 is formed from the insulating film to be the insulating film 408 (see FIGS. 12C1 and 12C2). The hard mask 410 functions as an etching stopper; therefore, the insulating film to be the insulating film 408 can be prevented from being etched excessively and the oxide semiconductor film 406 can be prevented from being thinned or from disappearing. Accordingly, the transistors with small variation in the plane of the substrate can be manufactured. Furthermore, the transistors with high yield can be manufactured. Therefore, the etching rate can be increased while the insulating film to be the insulating film 408 is planarized, so that productivity of the transistors can be increased. As a way to etch and planarize the insulating film to be the insulating film 408, a CMP method or the like may be used.

Then, a mask is formed over the hard mask 410. Note that a resist and/or a hard mask may be used as the mask. The mask may be formed by a photolithography method. Next, a region over which the mask is not provided in the hard mask 410 is etched to form the conductive film 416a and the conductive film 416b (see FIGS. 13A1 and 13A2).

As a result of such a process, the top surface of the insulating film 408 is positioned at the same level as the top surfaces of the conductive film 416a and the conductive film 416b. Furthermore, in the top view, the region where the conductive film 416a and the conductive film 416b are provided can be positioned on the inside of the region where the oxide semiconductor film 406 is provided. Therefore, the area of the transistor in the top view can be smaller than those of the transistors in the top views of FIGS. 1A to 1C, FIGS. 2A to 2C, FIGS. 5A to 5C, and FIGS. 7A to 7C. Therefore, the transistor having a reduced size can be obtained. Since the conductive film 416a and the conductive film 416b are formed by processing the hard mask 410, the process can be shortened as compared to a case where the conductive film 416a and the conductive film 416b are formed after the hard mask 410 is removed. Therefore, the productivity of the transistor can be increased. Furthermore, the hard mask 410 can inhibit damage to the oxide semiconductor film 406 at the time of etching and planarizing the insulating film to be the insulating film 408. Therefore, the transistor having stable electrical characteristics can be easily obtained.

Then, the insulating film 412 is formed. Note that the insulating film 412 may be formed using an insulating film selected from the insulating films described as examples of the insulating film 412. The insulating film 412 may be formed by a sputtering method, a CVD method, an MBE method, an ALD method, or a PLD method.

Next, a conductive film to be the conductive film 404 is formed. Note that the conductive film to be the conductive film 404 may be formed using a conductive film selected from the conductive films described as examples of the conductive film 404. The conductive film to be the conductive film 404 may be formed by a sputtering method, a CVD method, an MBE method, an ALD method, or a PLD method.

Then, a mask is formed over the conductive film to be the conductive film 404. Note that a resist and/or a hard mask may be used as the mask. The mask may be formed by a photolithography method or the like. Next, regions over which the mask is not provided in the conductive film to be the conductive film 404 are etched to form the conductive film 404.

Then, the insulating film 418 is formed. As a result, the transistor illustrated in FIGS. 10A to 10C can be manufactured (see FIGS. 13B1 and 13B2). Note that the insulating film 418 may be formed using an insulating film selected from the insulating films described as examples of the insulating film 418. The insulating film 418 can be formed by a sputtering method, a CVD method, an MBE method, an ALD method, or a PLD method.

Accordingly, a transistor having stable electric characteristics can be provided. Furthermore, a transistor with small variation in electrical characteristics can be provided. A miniaturized transistor can be provided. A transistor with low off-state current can be provided. A transistor having high on-state current can be provided.

In addition, a semiconductor device including the transistor can be provided. A highly integrated semiconductor device can be provided. A semiconductor device with high productivity can be provided. A semiconductor device with higher yield can be provided.

<Transistor Structure (5)>

A transistor of one embodiment of the present invention is described with reference to FIGS. 14A to 14C.

Figure 14A:
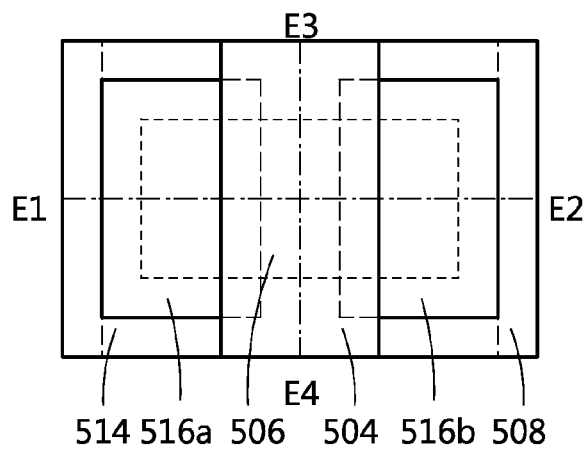
FIGS. 14A to 14C are a top view and cross-sectional views illustrating an example of a semiconductor device of one embodiment of the present invention.

FIG. 14A is a top view of the transistor. Here, some films are not illustrated for easy understanding.

Figure 14C:
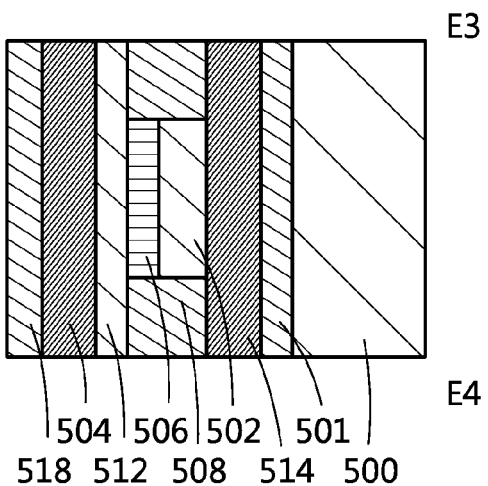
Figure 14B:
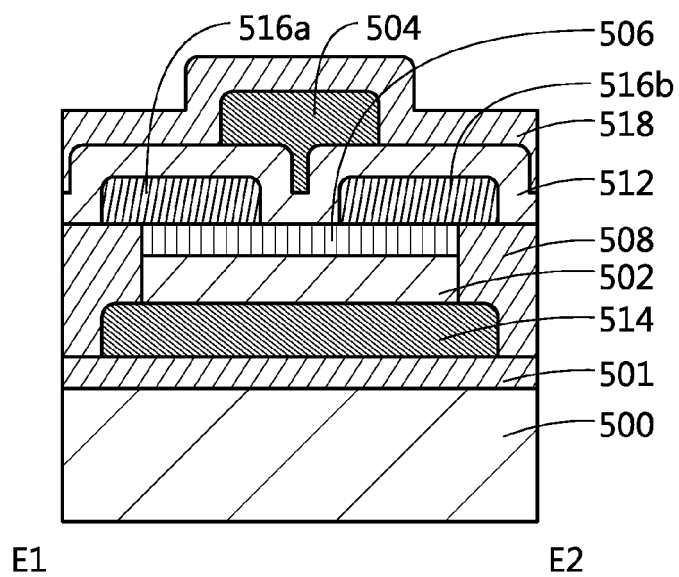

FIG. 14B is a cross-sectional view taken along dashed dotted line E1-E2 in FIG. 14A. FIG. 14C is a cross-sectional view taken along dashed-dotted line E3-E4 in FIG. 14A.

The transistor illustrated in FIGS. 14A to 14C includes an insulating film 501 over a substrate 500; a conductive film 514 over the insulating film 501; an insulating film 502 over the conductive film 514; an oxide semiconductor film 506 over the insulating film 502; and an insulating film 508 which is provided over the insulating film 501 and is in contact with the side surface of the conductive film 514, part of the top surface of the conductive film 514, the side surface of the insulating film 502, and the side surface of the oxide semiconductor film 506. Note that the top surface of the oxide semiconductor film 506 is positioned at substantially the same level as the top surface of the insulating film 508. Furthermore, the transistor in FIGS. 14A to 14C includes a conductive film 516a and a conductive film 516b that are over and in contact with at least the oxide semiconductor film 506 to be apart from each other; an insulating film 512 over the oxide semiconductor film 506, the conductive film 516a, and the conductive film 516b; a conductive film 504 over the insulating film 512; and an insulating film 518 over the insulating film 512 and the conductive film 504. Note that the transistor does not necessarily include all of the insulating film 501, the conductive film 516a, the conductive film 516b, the insulating film 512, the conductive film 514, and the insulating film 518.

Note that in the transistor illustrated in FIGS. 14A to 14C, the top surface of the insulating film 508 may be positioned at a higher level than the top surface of the oxide semiconductor film 506, in a manner similar to that of the transistor in FIGS. 7A to 7C. Alternatively, in a manner similar to that of the transistor in FIGS. 10A to 10C, the top surface of the insulating film 508 may be positioned at a higher level than the top surface of the oxide semiconductor film 506, and the top surfaces of the conductive film 516a and the conductive film 516b may be positioned at the same level as the top surface of the insulating film 508.

In the transistor in FIGS. 14A to 14C, the conductive film 514 functions as a first gate electrode. The insulating film 502 functions as a first gate insulating film. The conductive film 516a and the conductive film 516b function as a source electrode and a drain electrode. The insulating film 512 functions as a second gate insulating film. The conductive film 504 functions as a second gate electrode.

The conductive film 504 may be electrically connected to the conductive film 514. The electrical connection between the conductive film 504 and the conductive film 514 can reduce on-state resistance of the oxide semiconductor film 506, whereby the on-state current of the transistor can be increased. In addition, one of the conductive film 504 and the conductive film 514 may be used as a fixed potential and the other thereof may be used as a gate electrode for driving. The use of one of the conductive film 504 and the conductive film 514 as a fixed potential enables accurate switching of on/off even in a region of the oxide semiconductor film 506 away from the gate electrode for driving. Therefore, electrical-characteristic variation in the substrate can be reduced.

Note that although the side surface of each film included in the transistor in FIGS. 14A to 14C has a steep angle, one embodiment of the present invention is not limited to this shape. For example, the side surface of each film may have a tapered angle. In addition, although the top edge of each of the conductive film 514, the conductive film 516a, the conductive film 516b, the insulating film 512, the conductive film 504, and the insulating film 518 has a curvature, one embodiment of the present invention is not limited to this shape.

Although the insulating film 512 is provided over the oxide semiconductor film 506, the insulating film 508, the conductive film 516a, and the conductive film 516b in the cross-sectional view of the transistor in FIG. 14B, one embodiment of the present invention is not limited to this shape. For example, the insulating film 512 may be provided only in a region which overlaps the conductive film 504 in the top view of the transistor in FIG. 14A.

Although the conductive film 514 is provided to extend to the outside of the insulating film 502 and the oxide semiconductor film 506 in the cross-sectional view of the transistor in FIG. 14B, one embodiment of the present invention is not limited thereto. In the top view of the transistor in FIG. 14A, the width of the conductive film 514 may be the same as or smaller than the width of each of the insulating film 502 and the oxide semiconductor film 506, for example.

An sidewall insulating film may be provided in contact with the side surface of the conductive film 504. In the case where the sidewall insulating film is provided, the insulating film 512 may be provided only in a region which overlaps the conductive film 504 and the sidewall insulating film in the top view. Description of another insulating film is referred to for the sidewall insulating film.

For example, the conductive film 514 may be formed of a single layer or a stacked layer of a conductive film containing one or more of aluminum, titanium, chromium, cobalt, nickel, copper, yttrium, zirconium, molybdenum, ruthenium, silver, tantalum, and tungsten.

For the insulating film 501, the description of the insulating film 101 is referred to. The insulating film 501 is preferably an insulating film having an oxygen-blocking property. An insulating film having a hydrogen-blocking property is preferably used as the insulating film 501. An insulating film which releases a small amount of hydrogen is preferably used as the insulating film 501.

The description of the insulating film 102 can be referred to for the insulating film 502. Further, an insulating film containing excess oxygen is used as the insulating film 502. An insulating film containing excess oxygen refers to an insulating film from which oxygen is released by heat treatment.

The description of the oxide semiconductor film 106 can be referred to for the oxide semiconductor film 506.

For the insulating film 508, the description of the insulating film 108 is referred to an insulating film having an oxygen-blocking property is used as the insulating film 508. As the insulating film 508, an insulating film containing excess oxygen is preferably used. An insulating film having a hydrogen-blocking property is preferably used as the insulating film 508. An insulating film which releases a small amount of hydrogen is preferably used as the insulating film 508.

Note that the insulating film 508 may be similar to the insulating film 108 including the insulating film 108a and the insulating film 108b illustrated in FIGS. 2A to 2C.

The description of the conductive film 116a and the conductive film 116b is referred to for the conductive film 516a and the conductive film 516b.

For the insulating film 512, the description of the insulating film 112 is referred to. As the insulating film 512, an insulating film containing excess oxygen is preferably used.

The description of the conductive film 104 is referred to for the conductive film 504.

For the insulating film 518, the description of the insulating film 118 is referred to. The insulating film 518 is preferably an insulating film having an oxygen-blocking property. An insulating film having a hydrogen-blocking property is preferably used as the insulating film 518. An insulating film which releases a small amount of hydrogen is preferably used as the insulating film 518.

For the substrate 500, the description of the substrate 100 is referred to.

Note that the transistor illustrated in FIGS. 14A to 14C may have a structure in which the insulating film 501 is not provided and the insulating film 502 is in contact with the bottom surface of the insulating film 508, in a manner similar to that of the transistor illustrated in FIGS. 5A to 5C. A specific structure is illustrated in FIGS. 15A to 15C.

Figure 15A:
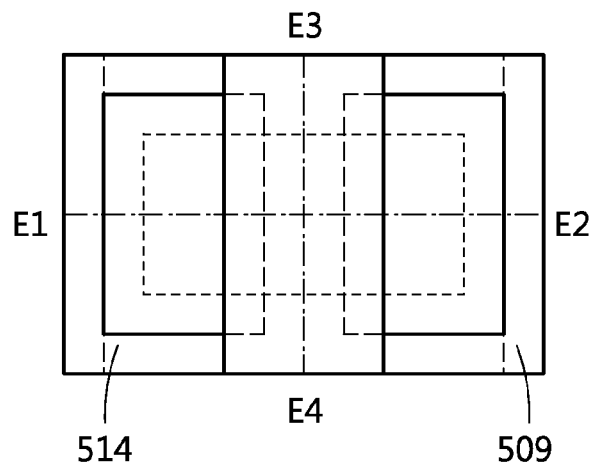
FIGS. 15A to 15C are a top view and cross-sectional views illustrating an example of a semiconductor device of one embodiment of the present invention.
Figure 15C:
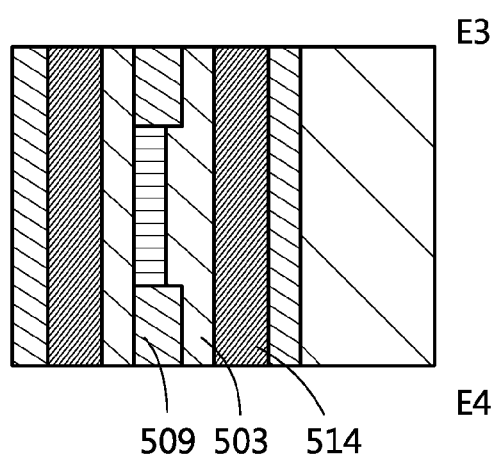
Figure 15B:
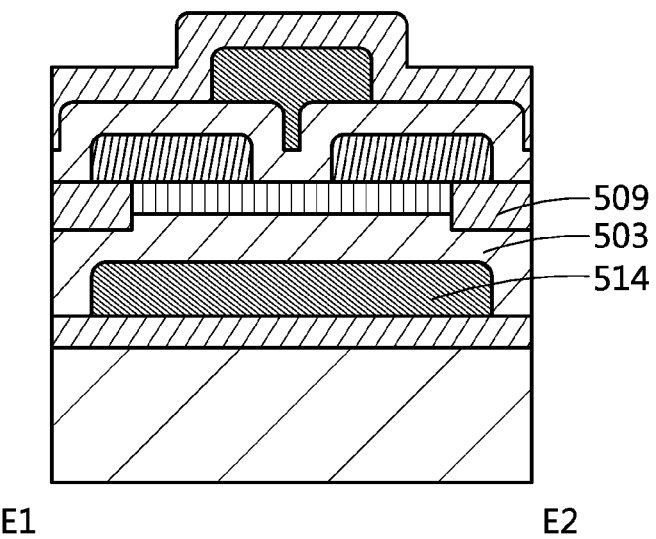

The insulating film 503 and the insulating film 509 in FIGS. 15A to 15C correspond to the insulating film 502 and the insulating film 508 in FIGS. 14A to 14C, respectively.

The kind of the insulating film in contact with the conductive film 514 in the transistor in FIGS. 15A to 15C can be different from that of the insulating film in the transistor in FIGS. 14A to 14C. Therefore, the flexibility in manufacturing might be increased by separate formation of the transistor in FIGS. 14A to 14C and the transistor in FIGS. 15A to 15C as appropriate.

The transistor illustrated in FIGS. 14A to 14C is surrounded by the insulating films having an oxygen-blocking property. For example, the insulating film 502 containing excess oxygen can be surrounded by the insulating film 501, the insulating film 508, and the oxide semiconductor film 506. Therefore, even when oxygen vacancy is generated in the oxide semiconductor film 506, the excess oxygen contained in the insulating film 502 can effectively reduce the oxygen vacancy. In the same manner, even when oxygen vacancy is generated in the oxide semiconductor film 506, the excess oxygen contained in the insulating film 512 can effectively reduce the oxygen vacancy. That is, the transistor illustrated in FIGS. 14A to 14C has stable electrical characteristics. In addition, since an increase in off-state current due to oxygen vacancy can be inhibited, the off-state current of the transistor is low. Furthermore, since the transistor includes the conductive film 504 functioning as a gate electrode and the conductive film 514, it can have high on-state current.

<Method for Manufacturing Transistor Structure (5)>

A method for manufacturing the transistor illustrated in FIGS. 14A to 14C is described below with reference to FIGS. 16A1 to 16C2 and FIGS. 17A1 to 17B2. The method for manufacturing the transistor is described to correspond to the cross-sectional views of FIGS. 14B and 14C.

First, the substrate 500 is prepared. Next, the insulating film 501 is formed. Note that the insulating film 501 may be formed using an insulating film selected from the insulating films described as examples of the insulating film 501. The insulating film 501 may be formed by a sputtering method, a CVD method, an MBE method, an ALD method, or a PLD method.

Next, a conductive film to be the conductive film 514 is formed. Note that the conductive film to be the conductive film 514 may be formed using a conductive film selected from the conductive films described as examples of the conductive film 514. The conductive film to be the conductive film 514 may be formed by a sputtering method, a CVD method, an MBE method, an ALD method, or a PLD method.

Then, a mask is formed over the conductive film to be the conductive film 514. Note that a resist and/or a hard mask may be used as the mask. The mask may be formed by a photolithography method or the like. Next, regions over which the mask is not provided in the conductive film to be the conductive film 514 are etched to form the conductive film 514 (see FIGS. 16A1 and 16A2).

Next, an insulating film to be the insulating film 502 is formed. Note that the insulating film to be the insulating film 502 may be formed using an insulating film selected from the insulating films given as examples of the insulating film 502. The insulating film to be the insulating film 502 may be formed by a sputtering method, a CVD method, an MBE method, an ALD method, or a PLD method.

Then, an oxide semiconductor film to be the oxide semiconductor film 506 is formed. Note that the oxide semiconductor film to be the oxide semiconductor film 506 may be formed using an oxide semiconductor film selected from the oxide semiconductor films given as examples of the oxide semiconductor film 506. The oxide semiconductor film to be the oxide semiconductor film 506 can be formed by a sputtering method, a CVD method, an MBE method, an ALD method, or a PLD method, for example.

Then, a mask is formed over the oxide semiconductor film to be the oxide semiconductor film 506. Note that a resist and/or a hard mask may be used as the mask. The mask may be formed by a photolithography method or the like.

Next, regions over which the mask is not provided in the insulating film to be the insulating film 502 and in the oxide semiconductor film to be the oxide semiconductor film 506 are etched to form the insulating film 502 and the oxide semiconductor film 506 (see FIGS. 16B1 and 16B2).

Next, an insulating film to be the insulating film 508 is formed. Note that the insulating film to be the insulating film 508 is preferably formed to a thickness larger than the total thickness of the insulating film 502 and the oxide semiconductor film 506. The insulating film to be the insulating film 508 may be formed using an insulating film selected from the insulating films described as examples of the insulating film 508. The insulating film to be the insulating film 508 can be formed by a sputtering method, a CVD method, an MBE method, an ALD method, or a PLD method. The insulating film to be the insulating film 508 is preferably formed using a sputtering method.

In the case where the insulating film to be the insulating film 508 is formed by a sputtering method, a deposition gas containing oxygen is preferably used. With the deposition gas, oxygen can be added to the side surface of the insulating film 502 and the side surface and top surface of the oxide semiconductor film 506 at the time of forming the insulating film to be the insulating film 508. The added oxygen serves as excess oxygen in the insulating film 502 and the oxide semiconductor film 506 and can be used to reduce oxygen vacancy in the oxide semiconductor film 506.

Next, the insulating film to be the insulating film 508 is etched and planarized until the top surface of the oxide semiconductor film 506 is exposed, whereby the insulating film 508 is formed from the insulating film to be the insulating film 508 (see FIGS. 16C1 and 16C2). As a way to etch and planarize the insulating film to be the insulating film 508, a CMP method or the like may be used.

Next, a conductive film to be the conductive film 516a and the conductive film 516b is formed over the insulating film 508 and the oxide semiconductor film 506. Note that the conductive film to be the conductive film 516a and the conductive film 516b may be formed using a conductive film selected from the conductive films described as examples of the conductive film 516a and the conductive film 516b. The conductive film to be the conductive film 516a and the conductive film 516b may be formed by a sputtering method, a CVD method, an MBE method, an ALD method, or a PLD method.

Then, a mask is formed over the conductive film to be the conductive film 516a and the conductive film 516b. Note that a resist and/or a hard mask may be used as the mask. The mask may be formed by a photolithography method or the like. Next, regions over which the mask is not provided in the conductive film to be the conductive film 516a and the conductive film 516b are etched to form the conductive film 516a and the conductive film 516b.

Next, the insulating film 512 is formed (see FIGS. 17A1 and 17A2). Note that the insulating film 512 may be formed using an insulating film selected from the insulating films given as examples of the insulating film 512. The insulating film 512 can be formed by a sputtering method, a CVD method, an MBE method, an ALD method, or a PLD method.

Then, a conductive film to be the conductive film 504 is deposited. Note that the conductive film to be the conductive film 504 may be formed using a conductive film selected from the conductive films given as examples of the conductive film 504. The conductive film to be the conductive film 504 can be formed by a sputtering method, a CVD method, an MBE method, an ALD method, or a PLD method.

Next, a mask is formed over the conductive film to be the conductive film 504. Note that a resist and/or a hard mask may be used as the mask. The mask may be formed by a photolithography method or the like. Next, regions over which the mask is not provided in the conductive film to be the conductive film 504 are etched to form the conductive film 504.

Then, the insulating film 518 is formed. As a result, the transistor illustrated in FIGS. 14A to 14C can be manufactured (see FIGS. 17B1 and 17B2). Note that the insulating film 518 may be formed using an insulating film selected from the insulating films described as examples of the insulating film 518. The insulating film 518 can be formed by a sputtering method, a CVD method, an MBE method, an ALD method, or a PLD method.

Accordingly, a transistor having stable electric characteristics can be provided. Furthermore, a transistor with small variation in electrical characteristics can be provided. A miniaturized transistor can be provided. A transistor with low off-state current can be provided. A transistor having high on-state current can be provided.

In addition, a semiconductor device including the transistor can be provided. A highly integrated semiconductor device can be provided. A semiconductor device with high productivity can be provided. A semiconductor device with higher yield can be provided.

The transistors described above are arranged in matrix, thereby forming an integrated circuit. Furthermore, appropriate combination with a transistor having another structure can provide a function of a display device, a sensor, a wireless device, a memory device, a CPU, or the like.

<Application Products>

Examples of electronic appliances each including the above-described semiconductor device are described below.

Figure 18A:
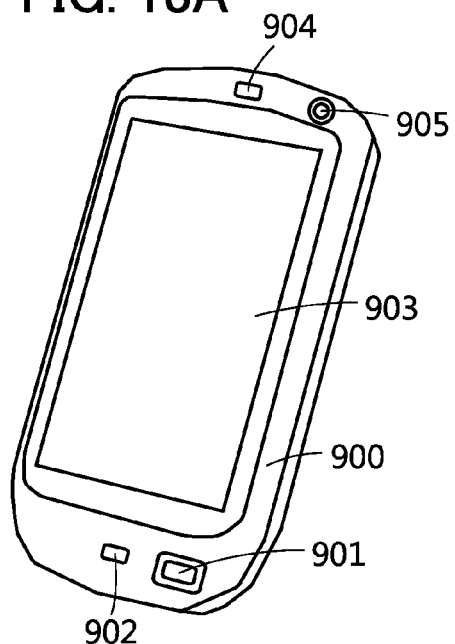
FIGS. 18A to 18D each illustrate an electronic appliance of one embodiment of the present invention.

FIG. 18A illustrates a portable information terminal. The portable information terminal illustrated in FIG. 18A includes a housing 900, a button 901, a microphone 902, a display portion 903, a speaker 904, and a camera 905, and has a function as a mobile phone. One embodiment of the present invention can be applied to an arithmetic unit, a wireless circuit, or a memory circuit in its main body. Alternatively, one embodiment of the present invention can be applied to the display portion 903.

Figure 18B:
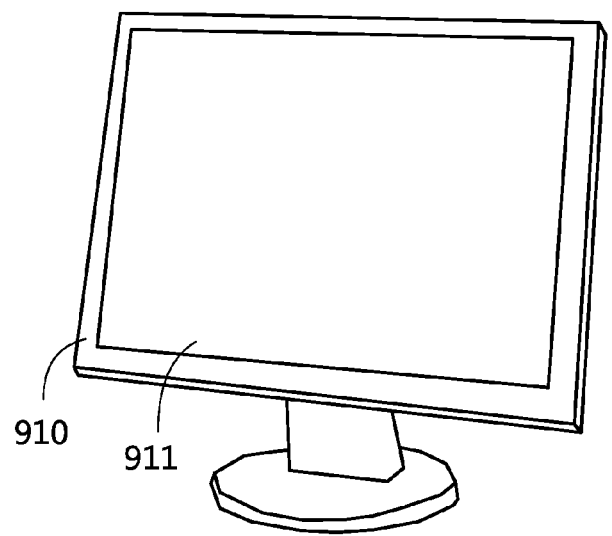

FIG. 18B illustrates a display. The display illustrated in FIG. 18B includes a housing 910 and a display portion 911. One embodiment of the present invention can be applied to an arithmetic unit, a wireless circuit, or a memory circuit in its main body. One embodiment of the present invention can also be applied to the display portion 911.

Figure 18C:
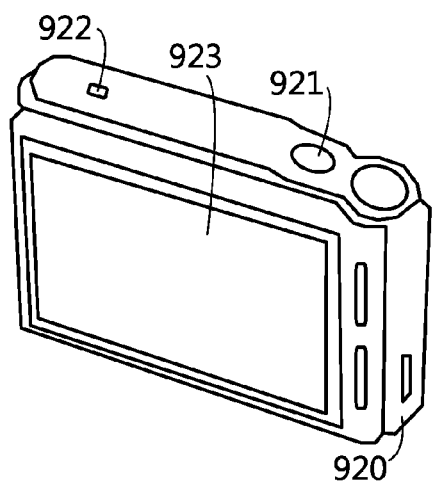

FIG. 18C illustrates a digital still camera. The digital still camera illustrated in FIG. 18C includes a housing 920, a button 921, a microphone 922, and a display portion 923. One embodiment of the present invention can be applied to an arithmetic unit, a wireless circuit, or a memory circuit in its main body. One embodiment of the present invention can also be applied to the display portion 923.

Figure 18D:
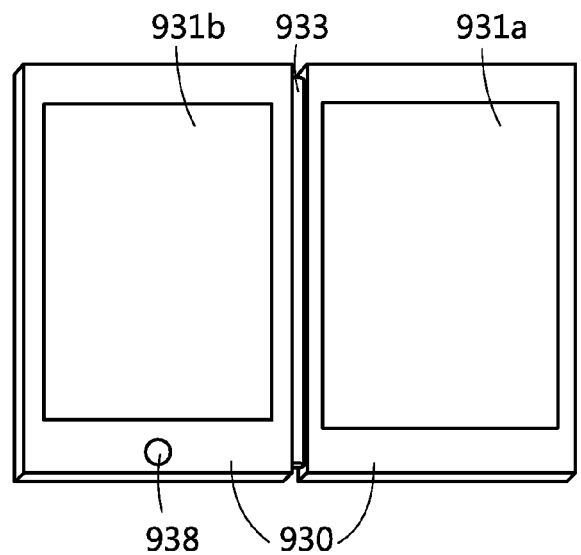

FIG. 18D illustrates a double-foldable portable information terminal. The double-foldable portable information terminal illustrated in FIG. 18D includes a housing 930, a display portion 931a, a display portion 931b, a hinge 933, and an operation switch 938. One embodiment of the present invention can be applied to an arithmetic unit, a wireless circuit, or a memory circuit in its main body. Alternatively, one embodiment of the present invention can be applied to the display portion 931a and the display portion 931b.

Note that part or whole of the display portion 931a and/or the display portion 931b can function as a touch panel. By touching an operation key displayed on the touch panel, a user can input data, for example.

With the use of the semiconductor device of one embodiment of the present invention, a high performance electronic device with low power consumption can be provided.

This application is based on Japanese Patent Application serial no. 2013-106165 filed with Japan Patent Office on May 20, 2013, the entire contents of which are hereby incorporated by reference.

What is claimed is:

1. A semiconductor device comprising:
   an island-shaped stack over a substrate, the island-shaped stack including a base insulating film and an oxide semiconductor film over the base insulating film;
   a protective insulating film over the substrate, wherein a side surface of the protective insulating film faces a side surface of the island-shaped stack;
   a first conductive film and a second conductive film over and in contact with the island-shaped stack, the first conductive film and the second conductive film being apart from each other;
   an insulating film over the island-shaped stack, the first conductive film, and the second conductive film; and
   a third conductive film over the insulating film and overlapping with the island-shaped stack,
   wherein a top surface of the oxide semiconductor film is coplanar with a top surface of the protective insulating film.

2. The semiconductor device according to claim 1, further comprising a fourth conductive film between the substrate and the island-shaped stack.

3. The semiconductor device according to claim 1, wherein the protective insulating film includes an aluminum oxide.

4. The semiconductor device according to claim 1, wherein a silicon oxide film containing excess oxygen is provided between the island-shaped stack and the protective insulating film.

5. The semiconductor device according to claim 1, wherein the base insulating film includes a silicon oxide film containing excess oxygen.

6. The semiconductor device according to claim 1, wherein the oxide semiconductor film contains indium, gallium, and zinc.

7. The semiconductor device according to claim 1, wherein the island-shaped stack includes a base oxide semiconductor film between the base insulating film and the oxide semiconductor film.

8. The semiconductor device according to claim 1, wherein the island-shaped stack includes a protective oxide semiconductor film over and in contact with the oxide semiconductor film.

9. A method for manufacturing a semiconductor device, comprising the steps of:
forming a base insulating film over a substrate;
forming an oxide semiconductor film over the base insulating film;
forming a mask over the oxide semiconductor film;
etching the base insulating film and the oxide semiconductor film by using the mask so that an island-shaped stack is formed;
removing the mask;
forming a protective insulating film over the island-shaped stack and the substrate;
etching and planarizing the protective insulating film so that an upper surface of the island-shaped stack is exposed;
forming a first conductive film and a second conductive film over the island-shaped stack, wherein the first conductive film and the second conductive film are apart from each other;
forming an insulating film over the island-shaped stack, the first conductive film, and the second conductive film; and
forming a third conductive film over the insulating film and overlapping with the island-shaped stack.

10. The method for manufacturing a semiconductor device, according to claim 9, further comprising the steps of:
before forming the base insulating film over the substrate, forming a fourth conductive film over the substrate.

11. The method for manufacturing the semiconductor device, according to claim 9, wherein the protective insulating film includes an aluminum oxide.

12. The method for manufacturing the semiconductor device, according to claim 9, wherein a silicon oxide film containing excess oxygen and an aluminum oxide film are formed in this order as the protective insulating film.

13. The method for manufacturing the semiconductor device, according to claim 9, wherein the base insulating film includes a silicon oxide film containing excess oxygen.

14. The method for manufacturing the semiconductor device, according to claim 9, wherein the oxide semiconductor film includes indium, gallium, and zinc.

15. A method for manufacturing a semiconductor device, comprising the steps of:
forming a base insulating film over a substrate;
forming an oxide semiconductor film over the base insulating film;
forming a first conductive film over the oxide semiconductor film;
etching the base insulating film and the oxide semiconductor film by using the first conductive film as a mask so that an island-shaped stack is formed;
forming a protective insulating film over the first conductive film, the island-shaped stack, and the substrate;
etching and planarizing the protective insulating film so that an upper surface of the first conductive film is exposed;
forming a resist mask over the first conductive film;
etching the first conductive film by using the resist mask so that a second conductive film and a third conductive film are formed, wherein the second conductive film and the third conductive film are apart from each other;
forming an insulating film over the island-shaped stack, the second conductive film, and the third conductive film; and
forming a fourth conductive film over the insulating film and overlapping with the island-shaped stack.

16. The method for manufacturing a semiconductor device, according to claim 15, further comprising the steps of:
before forming the base insulating film over the substrate, forming a fifth conductive film over the substrate.

17. The method for manufacturing the semiconductor device, according to claim 15, wherein the protective insulating film includes an aluminum oxide.

18. The method for manufacturing the semiconductor device, according to claim 15, wherein a silicon oxide film containing excess oxygen and an aluminum oxide film are formed in this order as the protective insulating film.

19. The method for manufacturing the semiconductor device, according to claim 15, wherein the base insulating film includes a silicon oxide film containing excess oxygen.

20. The method for manufacturing the semiconductor device, according to claim 15, wherein the oxide semiconductor film includes indium, gallium, and zinc.

* * * * *